(12) United States Patent
Yakabe et al.

(10) Patent No.: US 7,348,788 B2
(45) Date of Patent: Mar. 25, 2008

(54) PROBING CARD AND INSPECTION APPARATUS FOR MICROSTRUCTURE

(75) Inventors: Masami Yakabe, Tokyo (JP); Naoki Ikeuchi, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/393,953

(22) Filed: Mar. 31, 2006

(65) Prior Publication Data
US 2007/0069746 A1  Mar. 29, 2007

(30) Foreign Application Priority Data

| Mar. 31, 2005 | (JP) | ............................. 2005-102760 |
| Sep. 14, 2005 | (JP) | ............................. 2005-266720 |
| Mar. 30, 2006 | (JP) | ............................. 2006-093448 |

(51) Int. Cl.
*G01R 31/02* (2006.01)

(52) U.S. Cl. ...................................... 324/754

(58) Field of Classification Search ................. 324/754
See application file for complete search history.

(56) References Cited

U.S. PATENT DOCUMENTS

| 4,816,125 A |   | 3/1989 | Muller et al. |
| 6,232,790 B1 | * | 5/2001 | Bryan et al. ................. 324/754 |
| 2005/0279170 A1 | * | 12/2005 | Okumura et al. ........... 073/602 |

FOREIGN PATENT DOCUMENTS

| EP | 1 085 784 A2 | 3/2001 |
| JP | 1-502581 | 9/1989 |
| JP | 2-67956 | 3/1990 |
| JP | 5-34371 | 2/1993 |
| JP | 6-313785 | 11/1994 |
| JP | 9-33567 | 2/1997 |
| JP | 11-2643 | 1/1999 |
| TW | 548408 | 8/2003 |
| TW | 200403439 | 3/2004 |

OTHER PUBLICATIONS

European Search Report issued in corresponding Application No. 06006889.7 - 1528, dated Jul. 27, 2007.

* cited by examiner

*Primary Examiner*—Evan Pert
(74) *Attorney, Agent, or Firm*—Finnegan, Henderson, Farabow, Garrett & Dunner, L.L.P.

(57) ABSTRACT

A probing card and an inspection apparatus which precisely inspect a microstructure having a minute moving section by a simple method are provided. A probing card (6) has a speaker (2), and a circuit substrate (100) which fixes a probe (4), and the speaker (2) is disposed on the circuit substrate (100). The circuit substrate (100) is provided with an aperture region. As the speaker (2) is disposed on that region, a test sound wave is output to the moving section of the microstructure. The probe (4) detects a change in an electrical characteristic caused by the motion of the moving section according to the test sound wave, thereby inspecting the characteristic of the microstructure.

25 Claims, 15 Drawing Sheets

ACCELERATION IN X(Y)-AXIS

ACCELERATION IN Z-AXIS

OUTPUT IN X(Y)-AXIS $$V_{xout} = \left( \frac{R_{x3}}{R_{x2}+R_{x3}} - \frac{R_{x4}}{R_{x1}+R_{x4}} \right) \cdot V_{dd}$$

OUTPUT IN Z-AXIS $$V_{zout} = \left( \frac{R_{z3}}{R_{z1}+R_{z3}} - \frac{R_{z4}}{R_{z2}+R_{z4}} \right) \cdot V_{dd}$$

ROTATION AROUND X-AXIS

ROTATION AROUND Y-AXIS

ROTATION AROUND Z-AXIS

A: RESONANCE FREQUENCY RANGE
B: NON-RESONANCE FREQUENCY RANGE

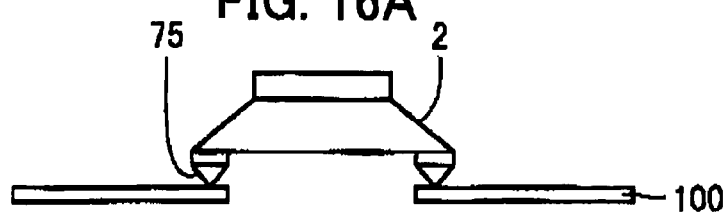
FIG. 16A
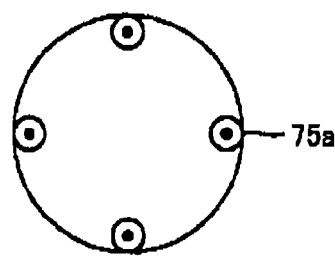
FIG. 16B
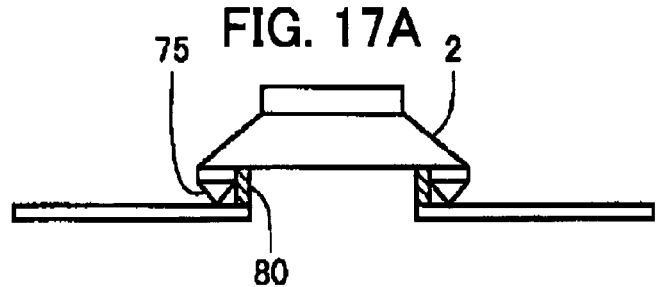
FIG. 17A
FIG. 17B
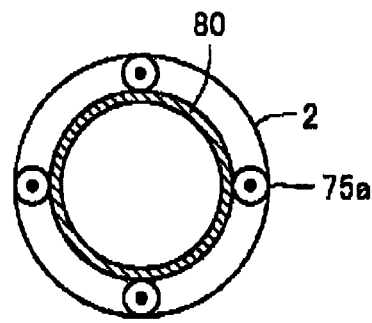
FIG. 18
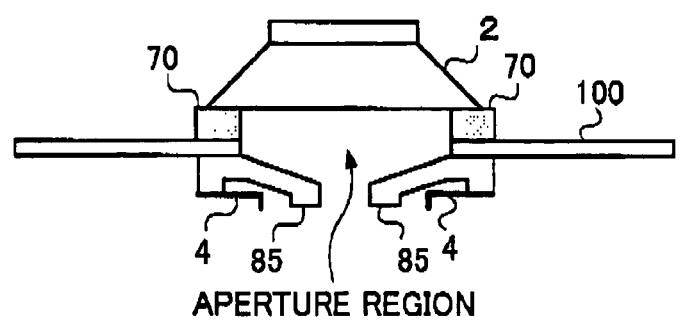
APERTURE REGION

PROBING CARD AND INSPECTION APPARATUS FOR MICROSTRUCTURE

BACKGROUND OF THE INVENTION

1. Field of the Invention

The present invention relates to a probing card and an inspection apparatus which inspect a microstructure like an MEMS (Micro Electro Mechanical System).

2. Description of the Related Art

Recently, an MEMS which is a device integrating various functions, such as mechanical, electrical, optical, and chemical functions by using specifically a semiconductor microfabrication technology or the like receives attention. An example of an MEMS technology which has been utilized so far is to put an MEMS device on micro sensors, such as accelerometers, pressure sensors, and airflow sensors as various sensors for automobiles and medical services. An inkjet printer head employing the MEMS technology enables increment of the number of nozzles which jet out inks and accurate ink jetting, thus ensuring improvement of a print quality and speeding up of a print speed. Further, micro mirror arrays used by reflection projectors are known as general MEMS devices.

It is expected that future development of various sensors and actuators using the MEMS technology will develop applications to optical communications, mobile devices, peripheral devices of computing machines, and further biological analyses and portable power source. The technology search report vol. 3 (issued on Mar. 28, 2005, by the technology research and information office of the industrial science and technology polity and environmental bureau, and the industrial machinery division of the manufacturing industries bureau, Japan ministry of economy, trade and industry) introduces various MEMS technologies under the topic "present situations and issues of technologies regarding MEMS".

A method of appropriately inspecting MEMS devices becomes important along with the development of MEMS devices because of fine structures. Conventionally, the characteristic of an MEMS device is evaluated by rotating the device after packaging, or by means of vibration or the like. As defects are detected by performing appropriate inspection at an early stage like a wafer condition after microfabrication, yield is improved and a manufacturing cost is fiber reduced.

Unexamined Japanese Patent Publication KOKAI publication No. H5-34371proposes an example of an inspection method which detects the changing resistance of an accelerometer and discriminates the characteristic of the accelerometer by blowing an air to the accelerometer formed on a wafer.

SUMMARY OF THE INVENTION

In general, a structure having a minute moving section like an accelerometer is a device which changes a response characteristic to minute movement. Accordingly, to evaluate the characteristic, it is necessary to perform highly precise inspection. The characteristic of the accelerometer must be evaluated with fine adjustment in the case of applying change to the device by blowing the air as disclosed in the aforementioned publication, but it is very difficult to control the flow volume of the air and uniformly blow the air to the device to do highly precise inspection. A complex and expensive tester is required to do such a difficult highly precise inspection.

With respect to the air blow, it is difficult to make the air have a directional characteristic, and blow the air to a specific location to do highly precise inspection.

The present invention has been made to solve the aforementioned problems, and it is an object of the invention to provide a probing card and a microstructure inspection apparatus which precisely inspect a microstructure having a minute moving section by a simple method.

To achieve the object, a probing card according to the first aspect of the present invention that is connected to an evaluation unit which evaluates a characteristic of at least one microstructure having a moving section formed on a substrate, comprises a probe electrically connected to an inspection electrode of the microstructure formed on the substrate to detect electrical change based on a motion of the moving section formed on the substrate at a time of testing, and a sound wave generator for outputting a test sound wave to the moving section of the microstructure.

The probing card according to the invention includes the sound wave generator for outputting a test sound wave to the moving section of the microstructure. An evaluation unit detects motion of the moving section of the microstructure having responded to the test sound wave output by the sound wave generator trough the probe, and evaluates the characteristic of the microstructure based on a detection result.

That is, as the probing card includes the sound wave generator alignment adjustment for the probe of the probing card positions the sound wave generator. Independent alignment adjustment for the sound wave generator is not required, and a mechanism for that independent alignment adjustment is not necessary. This improves efficiency, and facilitates a test with a simple method.

It is preferable that the probing card should further comprise a microphone which detects the test sound wave output from the sound wave generator. The characteristic of the test sound wave to be output from the sound wave generator is adjusted based on a detection result by the microphone.

It is preferable that the sound wave generator should output the test sound wave by a non-vibrational operation except a mechanical vibrational operation.

In particular, the sound wave generator includes a thermoacoustic engine which outputs the test sound wave based on heat-originated expansion or compression of an air.

It is preferable that the probing card should further comprise a fixation member which fixes the probe, and has an aperture region through which the test sound wave is output to the moving section of the microstructure from the sound wave generator.

In particular, the probing card further comprises a support member for mounting the sound wave generator on the fixation member, wherein the sound wave generator outputs the test sound wave by a mechanical vibrational operation, and the support member has a vibration absorbing material which suppresses vibration of the sound wave generator.

In particular, the support member has a plurality of point support sections which support the sound wave generator at plural points.

In particular, the probing card further comprises a soundproof material which is provided between the fixation member and the sound wave generator and along the aperture region in such a way that the test sound wave does not leak from between the fixation member and the sound wave generator.

In particular, the support member has at least one of a first and a second support member units provided between the sound wave generator and the fixation member. One of the first and second support member units is made of a vibration absorbing material, while the other support member unit is made of a material harder than the material of the one support member.

In particular, the probe protrudes with respect to the aperture region.

It is preferable that a leading end of the probe should be formed in such a manner as to vertically contact the inspection electrode of the microstructure.

In particular, the probing card further comprises a fixation member which fixes the probe, and a support member which supports the sound wave generator. The sound wave generator outputs the test sound wave by a mechanical vibrational operation. The fixation member has an aperture region through which the test sound wave is output to the moving section of the microstructure from the sound wave generator. The support member supports the sound wave generator in a hanging manner to the aperture region of the fixation member.

In particular, the probing card further, comprises a soundproof material which is provided between the fixation member and the sound wave generator and along the aperture region in such a way that the test sound wave does not leak from between the fixation member and the sound wave generator.

It is preferable that the probing card should further comprise a cover for covering the sound wave generator in an other region than the aperture region, and is joined to the fixation member.

In particular, the microstructure formed on the substrate is disposed at a position through which a central axis of the aperture region passes.

Further, the probing card has a plurality of sound wave generators, the fixation member has a plurality of aperture regions which are so provided as to respectively correspond to the plurality of sound wave generators, and through which the test sound wave is output to the moving section of the microstructure from each sound wave generator, and the microstructure formed on the substrate is disposed at a position through which a central axis of a region surface surrounded by central axes of the individual aperture regions passes.

In particular, the probing card further comprises a sound collecting member provided between the substrate and the probing card and along the aperture region in such a way that the test sound wave does not leak from between the substrate and the probing card, but is collected to the moving section.

It is preferable that the sound collecting member should be a part of the fixation member which fixes the probe.

It is preferable that the probing card should further comprise a conduction unit which ensures conduction between the probe and the inspection electrode with a fritting phenomenon.

In particular, the conduction unit comprises a fritting power source which is used for applying a voltage to the inspection electrode to cause the fritting phenomenon before a test, and a switching circuit which is connected to the fritting power source at a time of causing the fritting phenomenon before the test, and is connected to an external inspection apparatus at a time of testing.

A microstructure inspection apparatus according to the second aspect of the invention is connected to an evaluation unit which evaluates a characteristic of at least one microstructure having a moving section formed on a substrate, and comprises: the aforementioned probing card, and the evaluation unit which is connected to the probing card, and evaluates a characteristic of the microstructure. The evaluation unit detects motion of the moving section of the microstructure having responded to the test sound wave output from the sound wave generator, through the probe, and evaluates the characteristic of the microstructure based on a detection result.

BRIEF DESCRIPTION OF THE DRAWINGS

These objects and other objects and advantages of the present invention will become more apparent upon reading of the following detailed description and the accompanying drawings in which:

FIGS. 16A to 16B are diagrams for explaining the structure of a probing card according to the second modified example of the second embodiment of the invention;

FIGS. 17A and 17B are diagrams for explaining the structure of a probing card according to the third modified example of the second embodiment of the invention;

FIG. 18 is a diagram for explaining the structure of a probing card according to the fourth modified example of the second embodiment of the invention;

DETAILED DESCRIPTION OF THE PREFERRED EMBODIMENTS

Preferred embodiments of the invention will be described below with reference to the accompanying drawings. Note that the same or equivalent portions in the figures will be denoted by the same reference numbers, and explanations thereof will be omitted.

First Embodiment

Figure 1:
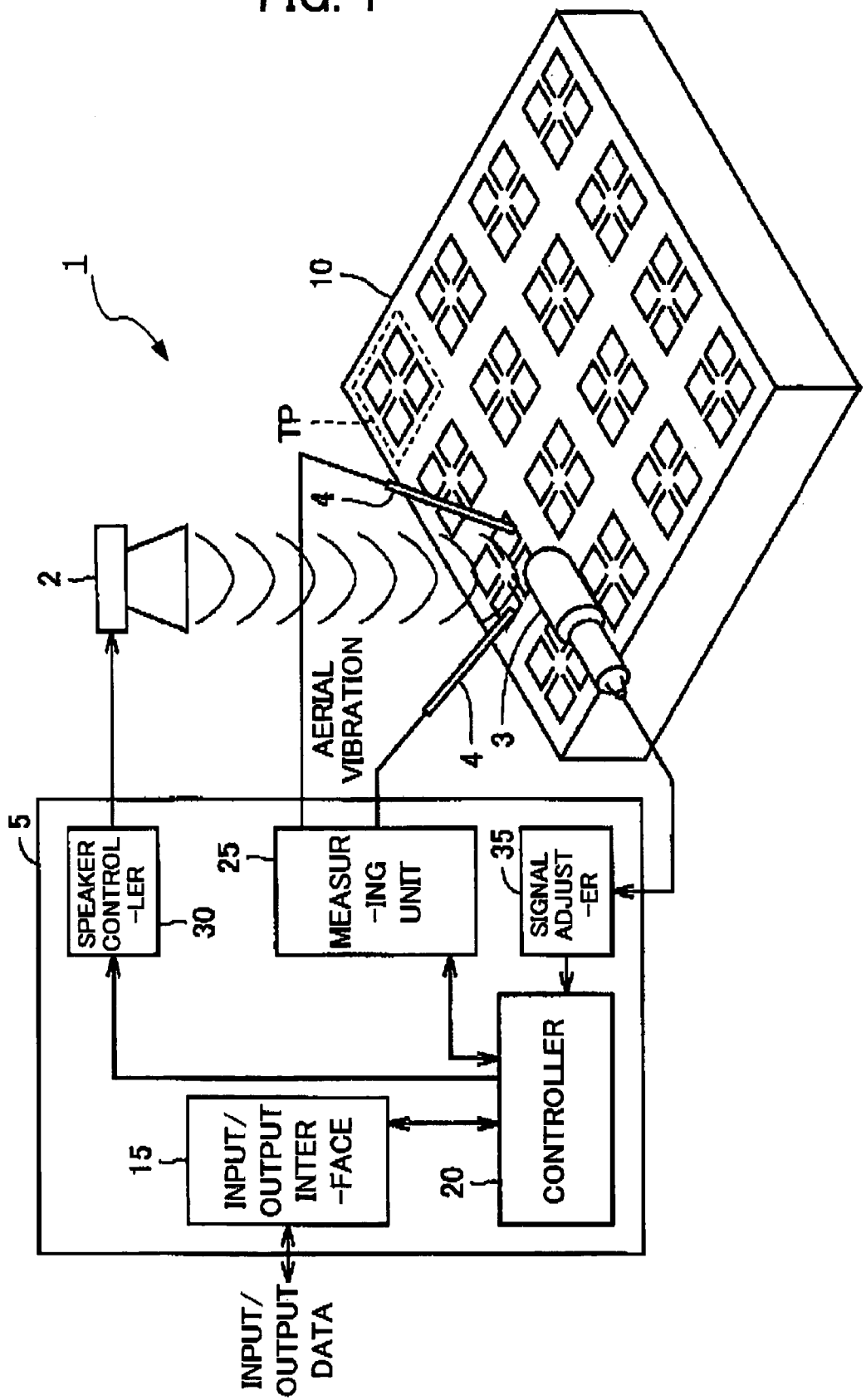
FIG. 1 is a schematic diagram illustrating the structure of a microstructure inspection system according to the first embodiment of the invention.

FIG. 1 is a schematic diagram illustrating the structure of a microstructure inspection system 1 according to the first embodiment of the invention.

Referring now to FIG. 1, the inspection system 1 of the first embodiment of the invention has a tester (inspection apparatus) 5 and a substrate 10 formed with a plurality of microstructure chips TP having minute moving sections.

In the example, a 3-axis accelerometer with multiple axes is taken as an example of a microstructure to be tested.

The tester 5 comprises a speaker 2 which outputs a sound wave as a compressional wave, an input/output interface 15 for executing data transmission of input/output data between the outside and inside of the tester 5, a controller 20 which generally controls the tester 5, probes 4 which contact a test target, a measurement section 25, which detects a measurement value to be an evaluation of the characteristic of the test target, through the probes 4, a speaker controller 30 which controls the speaker 2 in response to an instruction from the controller 20, a microphone (mic) 3 which detects an external sound, and a signal adjuster 35 which converts a sound wave detected by the mic 3 into a voltage signal, amplifies and outputs it to the controller 20. The mic 3 may be disposed near the test target As will be discussed later, the speaker 2, the mic 3 and the probes 4 are all provided in a single probing card.

The 3-axis accelerometer of the microstructure which is the test target will be explained first prior to an inspection method according to the embodiment.

Figure 2:
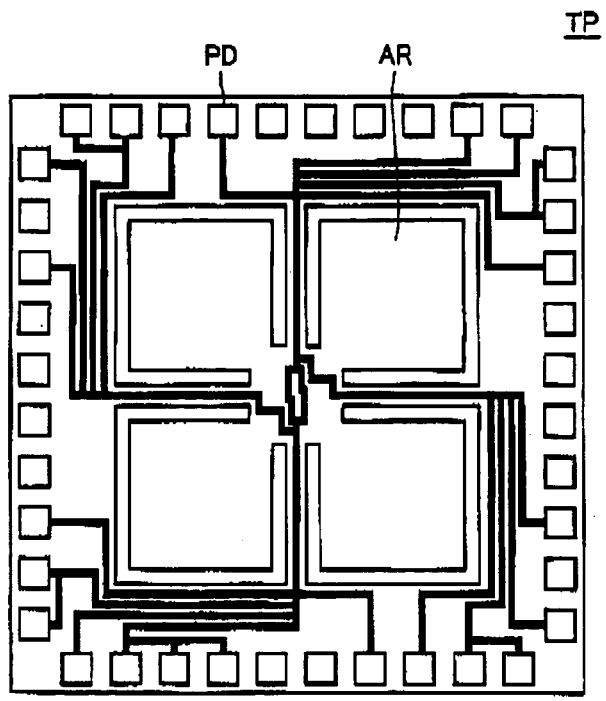
FIG. 2 is a diagram illustrating a 3-axis accelerometer as viewed from the above of the device.

FIG. 2 is a diagram illustrating the 3-axis accelerometer as viewed from the above of the device.

As illustrated in FIG. 2, a plurality of electrode pads PD are arranged around the chip TP formed at the substrate 10. Metal wires are provided for transmitting electrical signals from the electrode pads PD or thereto. Four weights AR which are formed in a clover-like shape as a whole are arranged at the center FIG. 3 is a schematic diagram of the 3-axis accelerometer.

Figure 3:
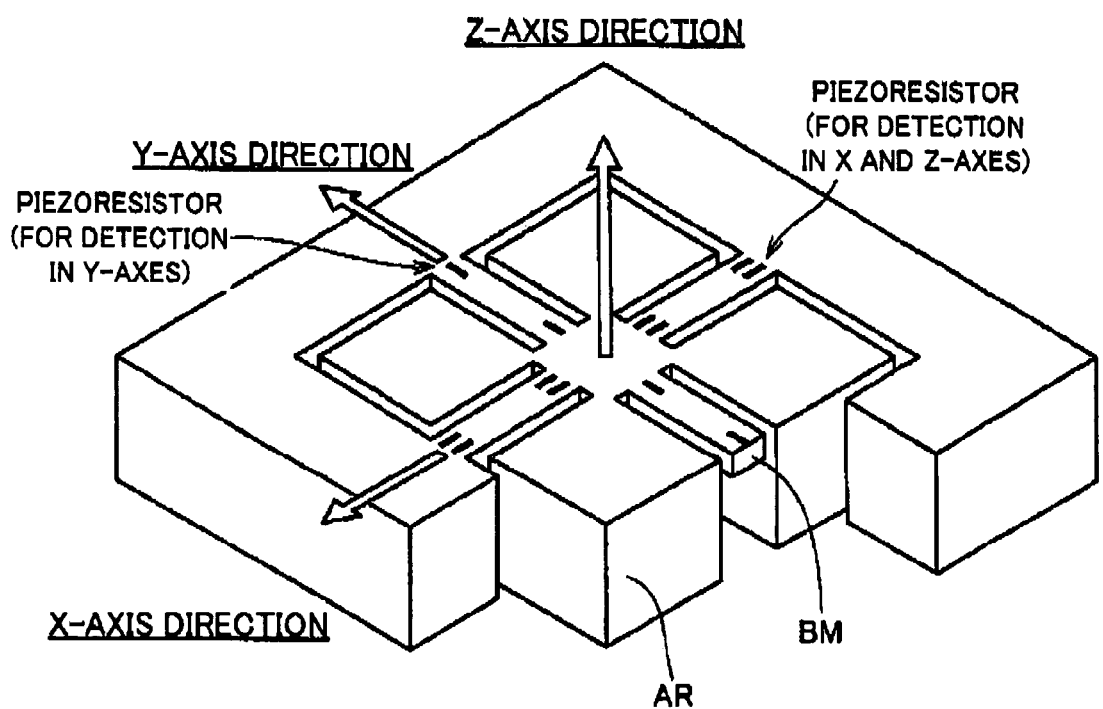
FIG. 3 is a schematic view of the 3-axis accelerometer.

Referring now to FIG. 3, the 3-axis accelerometer has piezoresistors which are piezoresistor type and detection elements as diffused resisters. The piezoresistor type accelerometer has advantages of miniaturization and cost reduction because it can utilize inexpensive IC processes and causes no sensitivity reduction even if resistance elements as detection elements are formed small in sizes.

Specifically, the accelerometer employs a structure such that the weights AR at the center are supported by four beams BM. The beams BM are formed in such a manner as to cross one another in two axial directions of X and Y, and have four piezoresistors per axis. The four piezoresistors for detection in the Z-axis direction are arranged horizontal to the piezoresistors for detection in the X-axis direction. The top faces of the weights AR form a clover-like shape entirely, and are connected together by the beams BM at the center. By employing the clover-like shape structure, the weights AR can be large in sizes, and beam lengths can elongate, so that a small size but highly sensitive accelerometer can be realized.

A mechanism such that the beams BM deforms as the weights AR receive acceleration (inertial force), the resistances of the piezoresistors formed on the surfaces of the beams BM change, thereby detecting acceleration is the operational principle of the piezoresistor type 3-axis accelerometer. A sensor output is set in such a manner as to be taken out from outputs of Wheatstone bridges to be discussed later and individually and independently embedded in three axes.

Figure 4:
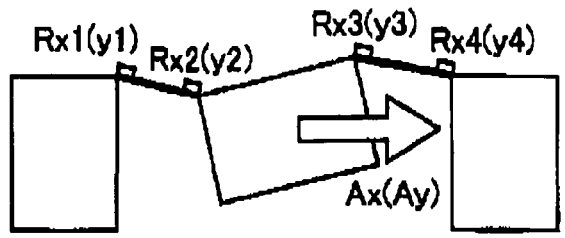
FIG. 4 is a conceptual diagram for explaining changes in shapes of weights and beams when acceleration in individual axial directions are applied.
Figure 4:
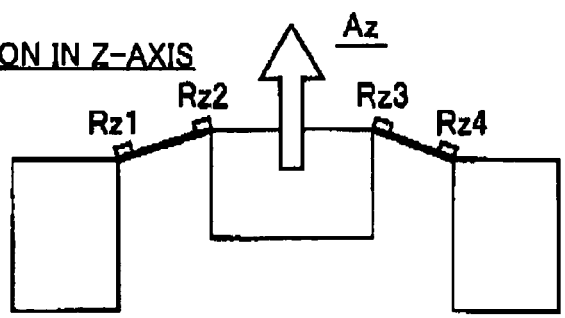

FIG. 4 is a conceptual diagram for explaining changes in the shapes of the weights and the beams when acceleration in the individual axial directions are applied.

As illustrated in FIG. 4, a piezoresistor has characteristics piezoresistance effects) that the resistance changes by applied stain, increases in a case of tensile strain, and decreases in a case of compressive strain. Piezoresistors Rx1 to Rx4 for X-axis direction detection, (piezoresistors Ry1 to Ry4 for Y-axis direction detection, and piezoresistors Rz1 to Rz4 for Z-axis direction detection are illustrated as examples.

Figure 5A:
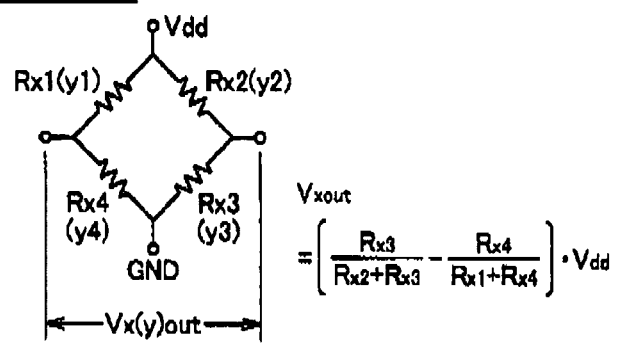
FIGS. 5A and 5B are circuit diagrams illustrating the structure of a Wheatstone bridge provided to each axis.
Figure 5B:
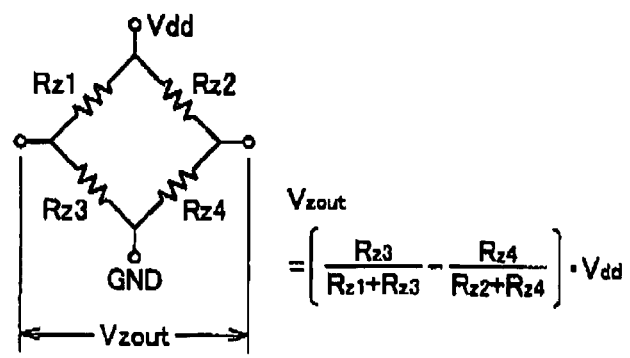

FIGS. 5A and 5B are circuit diagrams of the structures of the Wheatstone bridges provided to the individual axes.

FIG. 5A is the circuit diagram of the structure of the Wheatstone bridge in the X(Y)-axis. Let output voltages in the X-axis and the Y-axis be Vxout and Vyout, respectively.

FIG. 5B is a circuit diagram of the structure of the Wheatstone bridge in the Z-axis. Let an output voltage in the Z-axis be Vzout.

As mentioned above, the resistances of the four piezoresistors in each axis change due to applied strain, and based on that changes, in each piezoresistor, an acceleration component in each output axis of a circuit formed by the Wheatstone bridge is detected as an independently separated output voltage in, for example, the X-axis and the Y-axis, The aforementioned metal wires or the like illustrated in FIG. 2 are connected to constitute the aforementioned circuit, and an output voltage to each axis is set in such a manner as to be detected from a corresponding electrode pad.

The 3-axis accelerometer can be used as an inclination angle sensor which detects gravitational accelerations because it can detect the DC components of accelerations.

Figure 6A:
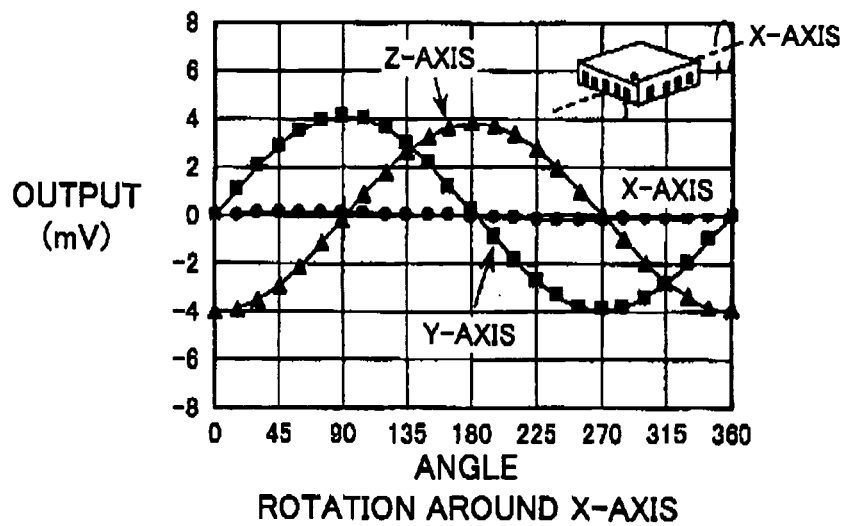
FIGS. 6A to 6C are diagrams for explaining the output responses of the 3-axis accelerometer with respect to inclination angles.
Figure 6B:
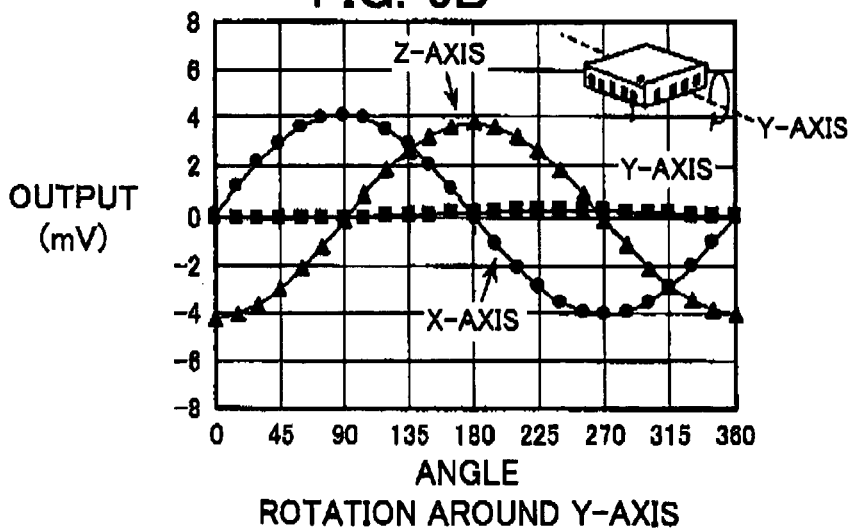
Figure 6C:
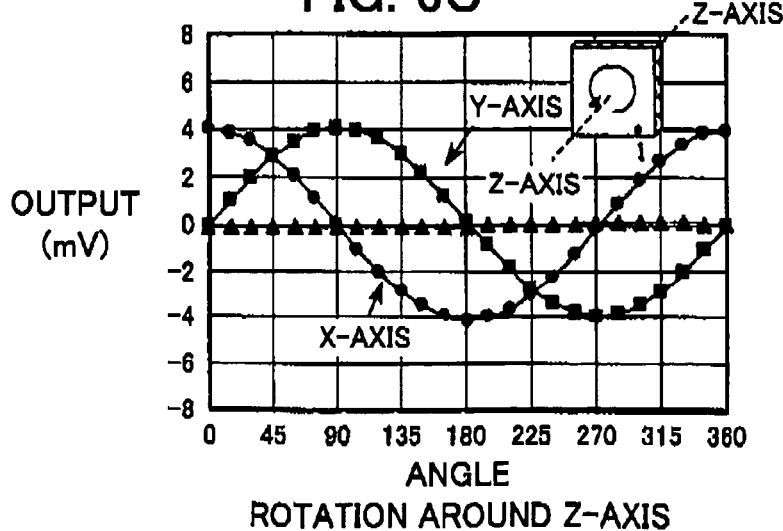

FIGS. 6A to 6C are diagrams for explaining output responses of the 3-axis accelerometer with respect to inclination angles.

As illustrated in FIGS. 6, the sensor is rotated around the X, Y, and Z-axes, and outputs of the bridges in the individual X, Y, and Z-axes are measured by a digital voltmeter. A Low-voltage power source of +5 V is used as the power source of the sensor. With respect to each measurement point illustrated in FIGS. 6A to 6C, a value that a zero point offset in each axis is arithmetically reduced is plotted.

Figure 7:
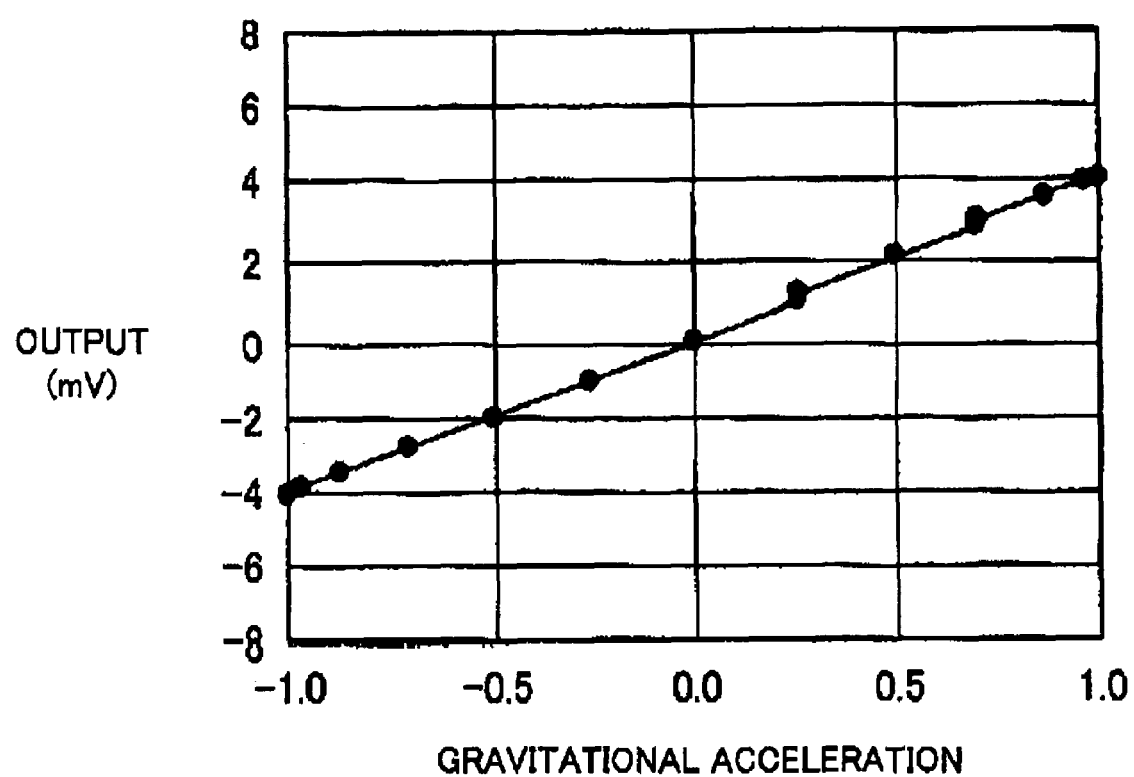
FIG. 7 is a diagram for explaining relationships between gravitational accelerations (inputs) and sensor outputs.

FIG. 7 is a diagram for explaining relationships between gravitational accelerations (inputs) and sensor outputs.

The input/output relationship illustrated in FIG. 7 is one that gravitational acceleration components relative to the individual X, Y, and Z-axes are calculated from the cosines of the inclination angles in FIGS. 6A to 6C, the relationship between gravitational accelerations (input) and sensor outputs are determined, and the linearity of inputs/outputs are evaluated. That is, the relationship between the accelerations and the output voltages is almost linear.

Figure 8A:
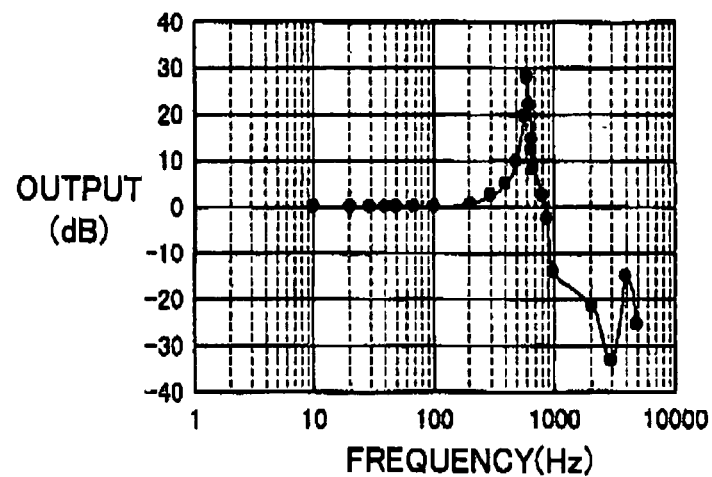
FIGS. 8A to 8C are diagrams for explaining the frequency characteristic of the 3-axis accelerometer.
Figure 8B:
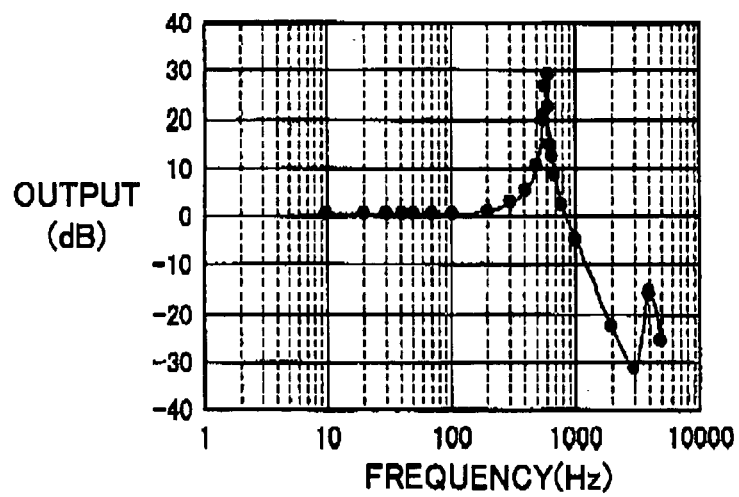
Figure 8C:
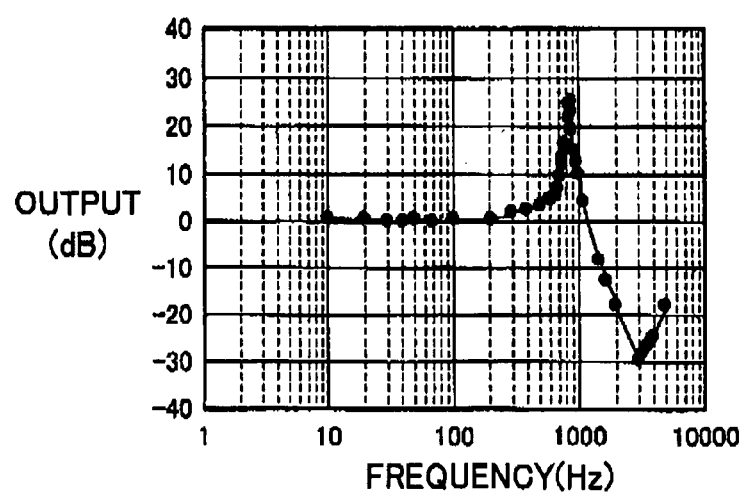

FIGS. 8A to 8C are diagrams for explaining the frequency characteristics of the 3-axis accelerometer.

As illustrated in FIGS. 8A to 8C, the frequency characteristics of the sensor outputs in the individual X, Y, and Z-axes indicate flat frequency characteristics up to around 200 Hz for all of the three axes, and resonate at 602 Hz in the X-axis, 600 Hz in the Y-axis, and 883 Hz in the Z-axis.

Referring back to FIG. 1, the microstructure inspection method of the embodiment of the invention is a method of outputting a sound wave as a compressional wave to the 3-axis accelerometer as a microstructure, detecting motion of a moving section of the microstructure based on the sound wave, and evaluating the characteristic of that motion.

The microstructure inspection method of the first embodiment of the invention will be explained with reference to the flowchart in FIG. 9.

Figure 9:
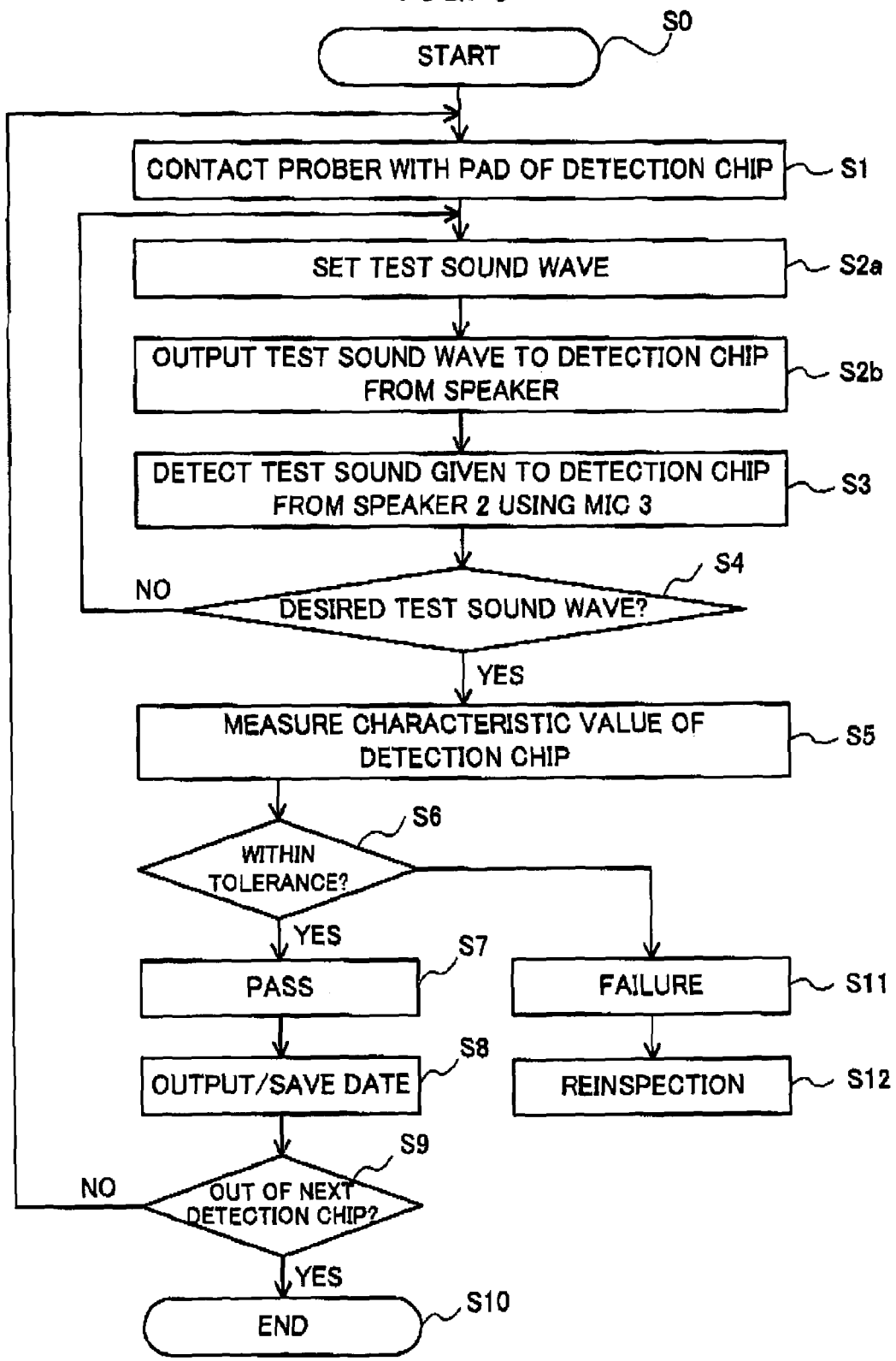
FIG. 9 is a flowchart for explaining a microstructure inspection method according to the first embodiment of the invention.

Referring now to FIG. 9, first, an inspection (test) for a microstructure is started (step S0). Next, the probes 4 are contacted with the electrode pads PD of the detection chip TP (step S1. Specifically, the probes 4 are contacted with predetermined electrode pads PD to detect the output voltage of the Wheatstone bridge circuit explained by FIG. 5. The structure which employs the pair of probes 4 are illustrated in FIG. 1, but may use plural pairs of probes. Using plural pairs of probes enables detection of output signals in parallel, Next a test sound wave to be output from the speaker 2 is set (step S2a). Specifically, the controller 20 accepts external input of input data through the input/output interface 15. The controller 20 controls the speaker controller 30, and instructs the speaker controller 30 to output a test sound wave with a desired frequency and a desired sound pressure through the speaker 2 based on the input data. Next, the test sound wave is output from the speaker 2 to the detection chip TP (step S2b).

Subsequently, the mic 3 detects the test sound wave given to the detection chip TP from the speaker 2 (step S3). The signal adjuster 35 converts the test sound wave detected by the mic 3 into a voltage signal, amplifies and outputs it to the controller 20.

Next, the controller 20 analyzes the voltage signal input from the signal adjuster 35, discriminates it, and determines whether the desired test sound wave arrives or not (step S4).

In the step S4, when the controller 20 has determined that it is the desired test sound wave, the process proceeds to the next step S5, and the controller 20 measures the characteristic value of the detection chip. Specifically, the measurement section 25 measures the characteristic value based on an electrical signal transmitted through the probes 4 (step S5).

Specifically, the moving section of the microstructure of the detection chip moves because of the arrival of the test sound wave as the compressional wave, i e., aerial vibration. Regarding the resistance of the 3-axis accelerometer as the microstructure which changes in accordance with that movement, it is possible to measure a change in the resistance based on an output voltage given through the probes 4.

In the step S4, when the controller 20 has determined that it is not the desired test sound wave, the process returns to the step S2a, and the test sound wave is set again. At this time, the controller 20 instructs the speaker controller 30 to correct the test sound wave. The speaker controller 30 responds the instruction from the controller 20, finely adjusts the frequency and/or the sound pressure to obtain the desired test sound wave, and patterns control in such a way that the desired test sound wave is output from the speaker 2. Explained in the example is a method of detecting the test sound wave and performing correction to obtain the desired test sound wave, but in a case where the desired test sound wave arrives at the microstructure of the detection chip beforehand, means of correcting the test sound wave and the method of correcting the test sound wave may be particularly omitted. Specifically, the processes from the step S2a to the step S4 are executed beforehand prior to the start of the test, and the speaker controller 30 stores a control value for outputting the desired test sound wave. Then, at the time of the actual test for the microstructure, as the speaker controller 30 controls input to the speaker 2 by using the stored control value, it is possible to omit the processes of the steps S3 and S4 at the time of the test.

Next, the controller 20 determines whether or not the measured characteristic value, i.e., measurement data is in a tolerance (step S6). In the step S6, when the measurement data is in the tolerance, the controller 20 determines that it passes the test (step S7), outputs and saves the data (step S8). The process proceeds to step S9. As the controller 20 determines, for example, whether or not a desired output voltage is obtained in response to the sound pressure of the test sound wave output from the speaker 2 as an example of the tolerance determination, to be more precise, whether or not the resistance of the 3-axis accelerometer changes linearly in response to a change in the sound pressure of the test sound wave output from the speaker 2, i.e., whether the linear relationship explained by FIG. 7 is obtained or not, it is possible to determine whether a chip has appropriate characteristics. Regarding data storing, data is stored in a non-illustrated memory section like a memory provided inside the tester 5, based on an instruction from the controller 20.

If there is no chip to be inspected next, the inspection of the microstructure (test) is terminated (step S10).

In the step S9, if there is the next chip to be inspected, the process returns to the first step S1, and the aforementioned inspection is executed.

In the step S6, when having determined that the measured characteristic value, i.e., the measured data is not in the tolerance, the controller 20 determines that it fails the test (step S11), and reinspects it (step S12). Specifically, a chip determined as out of the tolerance is removed by the reinspection. Or, Chips determined as out of the tolerance can be divided into plural groups. That is, it is conceivable that there may be lots of chips which can be fine for actual shipping if repaired, corrected, or the like, even if they do not pass strict test conditions. Accordingly, chips are selected by carrying out grouping of the chips by the reinspection or the like, and can be shipped based on a selection result.

Explained as an example in the embodiment has been a configuration that detects and determines a change in the resistance of the piezoresistor provided at the 3-axis accelerometer from an output voltage based on the motion of the 3-axis accelerometer, but it is possible to employ a configuration that detects and determines a change in the impedance of a capacitive element, a reactance element or the like, not limited to the resistance element, or changes in a voltage, a current, a frequency, a phase difference, a delay time, a position and the like based on a change in the impedance.

Figure 10:
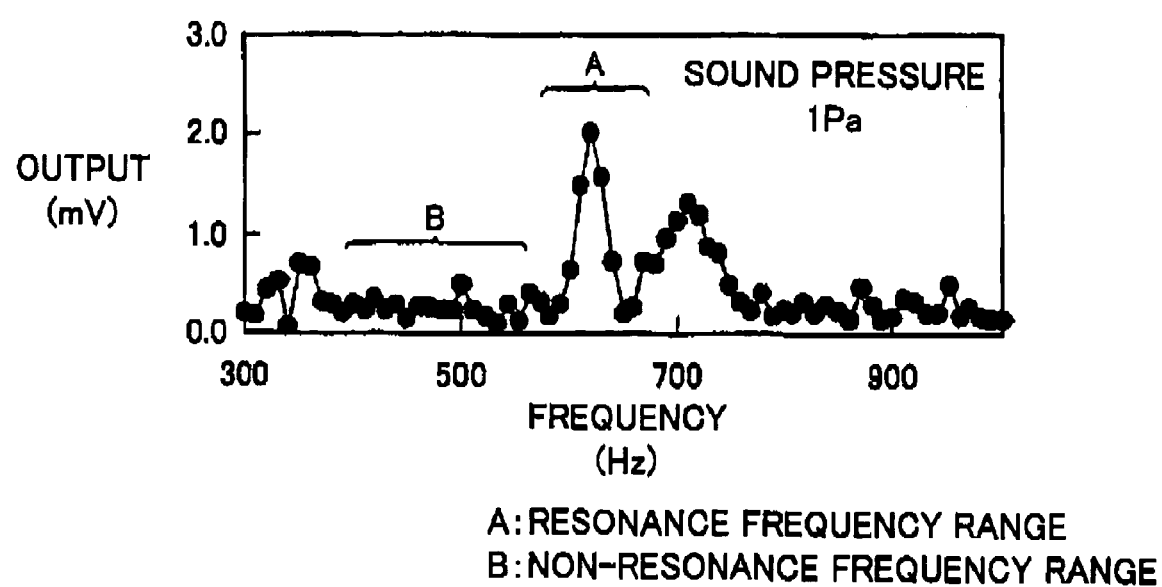
FIG. 10 is a diagram for explaining the frequency responses of the 3-axis accelerometer which responses test sound waves output from a speaker.

FIG. 10 is a diagram for explaining the frequency response of the 3-axis accelerometer which responds to the test sound wave output from the speaker 2. Provided that resonance frequencies after packaging are shown. The same is true for FIG. 8.

In FIG. 10, output voltages output from the 3-axis accelerometer when a 1 Pa (Pascal) test sound wave is given as a sound pressure and its frequency is changed. The vertical axis represents the output voltages of the 3-axis accelerometer (mV), and the horizontal axis represents the frequencies of the test sound wave (Hz). Output voltages obtained with respect to the X-axis are particularly shown.

As illustrated in FIG. 10, two regions A, B are shown. Specifically, a resonance frequency region A and a non-resonance frequency region B are shown.

Referring now to FIG. 10, a frequency having the largest output voltage, i.e., a frequency at which the largest output voltage changed by resonance can be obtained corresponds to a resonance frequency. In FIG. 10, a frequency corresponding to this output is approximately 600 Hz. That is, it almost matches with the frequency characteristic in the X-axis of the 3-axis accelerometer.

Therefore, for example, it is possible to specify a resonance frequency from an output voltage characteristic obtained by changing the frequency of the test sound wave with the sound pressure being constant, and this enables determination whether the specified resonance frequency is a desired resonance frequency or not by comparing the specified resonance frequency with the desired resonance frequency. Frequencies relating to the X-axis only are illustrated in the example, but since it is possible to obtain similar frequency characteristics for the Y-axis and the Z-axis, it is possible to evaluate the characteristic of the accelerometer in the three individual axes.

For example, when a resonance point as the resonance frequency resonates at frequencies except a frequency of 600 Hz, it is possible to determine that the chip fails because an appropriate and desired frequency cannot be obtained in the corresponding axis. That is, although a visual inspection is difficult because it is particularly a microstructure, an internal structural breakage, a crack presenting a moving section of the microstructure can be inspected. The explanation has been given to the case where a resonance frequency is specified from the largest output voltage, but the amount of displacement of the moving section becomes largest by resonance. Therefore, a frequency at which the largest displacement can be obtained corresponds to a resonance frequency. Accordingly, a resonance frequency is specified from the largest displacement compared with the desired resonance frequency as mentioned above to do failure determination.

The sound pressure of the test sound wave is changed by using the frequency region of the region B, i.e., non-resonance frequency region, and detection and inspection for the sensitivity, offset, and the like of the 3-axis accelerometer can be performed from an output result.

In the example, although the explanation has been given to a method of inspecting a chip TP via the probe 4, similar inspections to a plurality of chips in parallel can be performed as the test sound wave scatters evenly. As controlling the frequency and the sound pressure of the test sound wave is relatively easy, the structure of the apparatus can be simplified in comparison with the structure of controlling the flow rate of an air or the like.

As explained above, the structures of the inspection method and inspection apparatus according to the first embodiment of the invention ensures precise inspection of the characteristic of a microstructure from the movement of the microstructure by a simple method of controlling a sound wave which is a compressional wave.

The method of output a test sound wave and inspecting the characteristic of the moving section of the microstructure has been explained, and the structure of a probing card which carries out electrical connection between the microstructure and the tester at the time of executing the test will be explained below.

Figure 11:
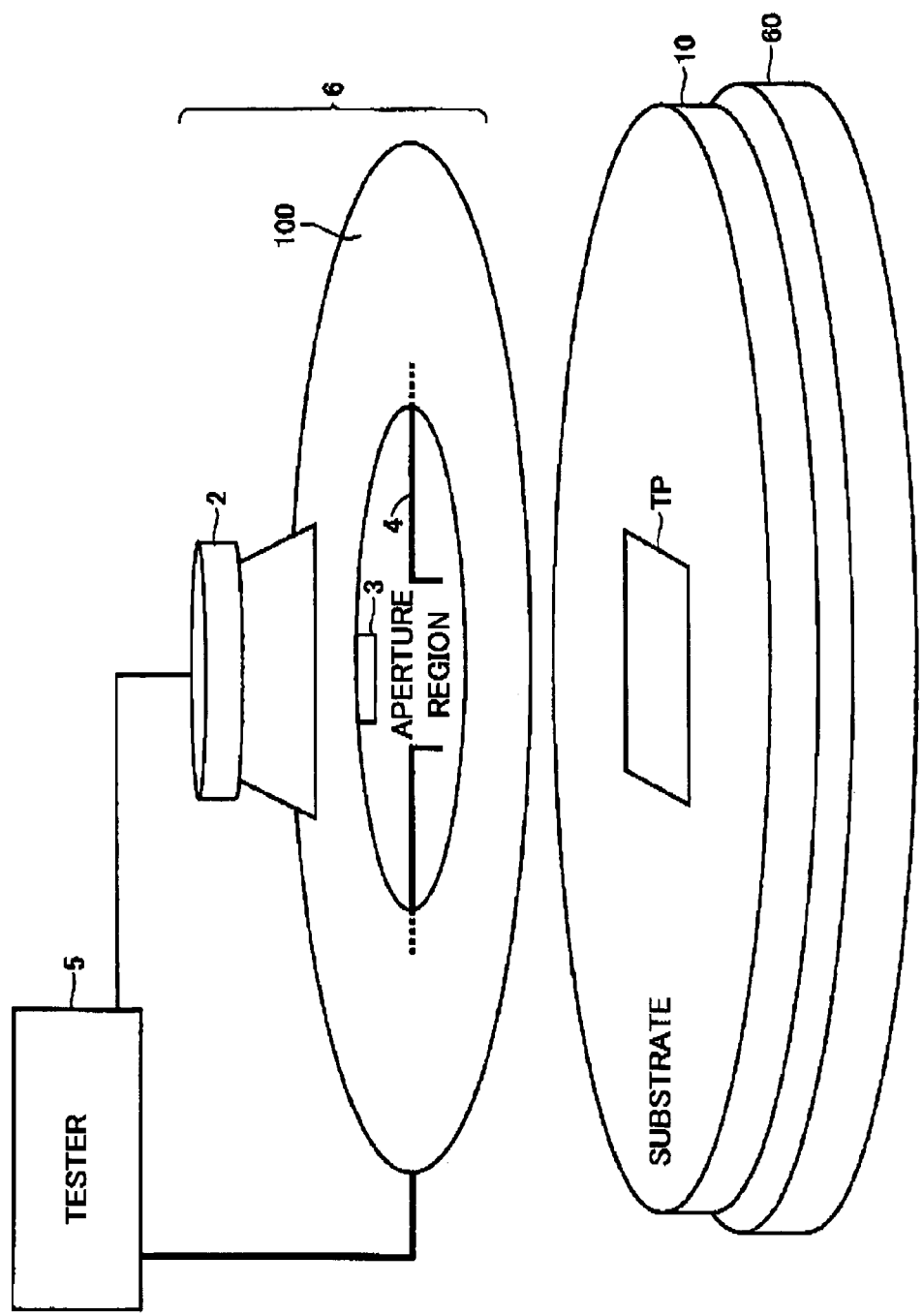
FIG. 11 is a diagram for explaining a probing card which is electrically connected to an electrode pad of a microstructure at the time of testing according to an embodiment of the invention.

FIG. 11 is a diagram for explaining a probing card 6 which is connected to the electrode pad of the microstructure at the time of the test according to an embodiment of the invention.

The probing card is not limited to a card-like shaped member as illustrated in FIG. 11. As will be discussed later, the shape of the probing card may be a box-like shape containing a speaker 2 and its cover. In the invention, a structure which has the probes 4 for electrical connection with the electrode pads PD of the microstructure and is subject to alignment control for positioning the probes 4 and the electrode pads PD is called probing card Referring now to FIG. 11, the probing card 6 according to the embodiment of the invention includes a circuit substrate 100 which fixes and electrically connects plural probes 4 together, the mic 3 connected to the circuit substrate 100, and the speaker 2. The circuit substrate 100 is provided with an aperture region at the center as an example. The speaker 2 is disposed in such a way that a test sound wave is output to the moving section of a chip TP of a microstructure of a wafer 10 from the top face portion of the circuit substrate 100 through the aperture region. Provided that the mic 3 is provided at a bottom face portion of the circuit substrate 100.

Normally, electrode pads which are inspection electrodes electrically connected to probes are formed at peripheral regions of a chip TP as illustrated in FIG. 2. Therefore, as the aperture region is provided at a region surrounded by the probes and the speaker 2 is disposed above that region, it is possible to output a test sound wave directly from the above of the moving section of the microstructure. The probes are disposed in such a manner as to protrude with respect to the aperture region as an example. This structure enables the protruding probes to appropriately contact the inspection electrodes when the above of the inspection electrodes of the microstructure is the aperture region.

At least the leading end of the probe is so formed as to vertically contact the inspection electrode of the microstructure. This results in application of a contact pressure only in the vertical direction (Z-axis direction in FIG. 3), so that application of the contact pressure in the horizontal direction (X-axis or Y-axis direction in FIG. 3) is suppressed, and disturbance originating from the contact pressure as disused later will be suppressed.

A stage 60 which performs vacuum contact with the wafer 10 for carrying it is provided below the wafer 10. A non-illustrated alignment adjusting mechanism which performs alignment adjustment on the probing card 6 to a proper position of the wafer 10 is also provided.

By employing the aforementioned structure, work efficiency can be improved because alignment adjustments to the speaker 2 and the microphone 3 are carried out at the same time when alignment adjustment to the probes 4 of the probing card 6 is carried out, so that independent alignment adjustment is not required. In a case where individual alignment adjustments are carried out independently, it is necessary to provide adjustment mechanisms individually, so that a cost of the tester increases, and a complex control is requisite for individual controls.

Using the probing card which employs the structure according to the invention improves the work efficiency, reduces the costs of adjustment mechanisms, and facilitates controls, so that overall cost of the tester is reduced.

Next, the structure of the probing card 6 will be explained.

Figure 12:
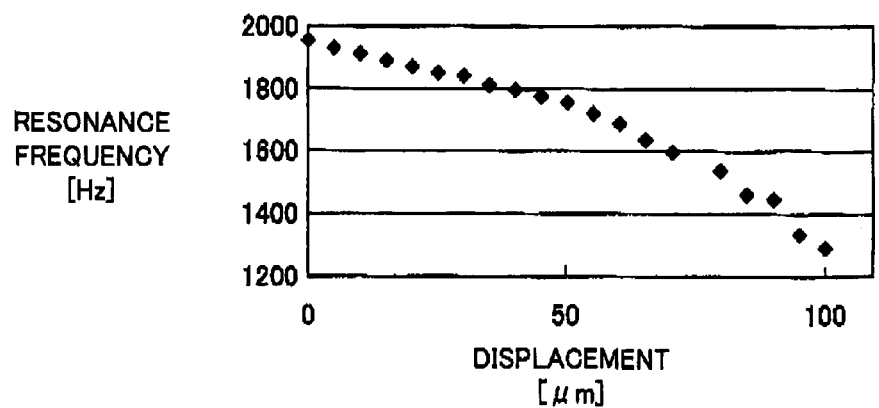
FIG. 12 is a diagram for explaining changes in resonance frequencies when the leading ends of probes are pressed against the inspection electrodes of the accelerometer.

FIG. 12 is a diagram for explaining a change in resonance frequencies when the leading ends of the probes are pressed against the inspection electrodes of the accelerometer.

The horizontal axis represents the displacements of the probing card 6 against which the leading ends of the probes are pressed. The vertical axis represents measured values of the resonance frequencies of the microstructure. As the displacement of pressing the leading ends of the probes increases, the contact pressure increases.

Referring now to FIG. 12, the more contact pressure increases, the more a resonance frequency decreases. This represents that the frequency characteristic of the device changes because of the influence of the contact pressure.

In a case of the microstructure having a moving section like an MEMS device in particular, there is a possibility that the movement of the moving section changes by pressing the probes 4, i.e., there is a possibility that the response characteristic of the device changes. There are two factors regarding affects originating from contacting with the probes 4. One is that affects of vibrations other than the test sound wave is superimposed by transmission of the vibrations to the microstructure through the probes 4. The other one is that unnecessary stresses are applied to the microstructure because of the contact pressures from the probes 4, so that the movement of the moving section of the microstructure changes.

Accordingly, in order to execute highly precise measurement, i.e., in order to measure the original response characteristic of the device, it is desirable that transmissions of the vibration from the probes 4 should be avoided to eliminate the first affect, and the contact pressures should be reduced as small as possible and the directions of the contact pressures should be limited so that the microstructure does not deform to eliminate the second affect.

To eliminate the first affect, as will be discussed later, the speaker 2 is structured in such a manner as to be supported by a support member made of a vibration absorbing material on the circuit substrate 100. Possible speaker 2 disposed over the circuit substrate 100 with the structure of the invention is one which outputs a test sound wave without a mechanical vibration.

For example, a thermoacoustic engine which expands and compresses an air by application of a heat and outputs a sound can be used as the speaker 2. By employing this structure, no mechanical vibration is transmitted to the probes 4 from the speaker 2. Accordingly, an affect of an external disturbance is suppressed, thereby ensuring a highly precise inspection.

As the contact pressure is reduced to reduce that affect for the microstructure because of the stress originating from contacting with the probes 4, a contact resistance between the probe 4 and the electrode pad PD increases. The stress of the contact pressure and the contact resistance are in a trade-off relationship. Accordingly, the inspection method of the embodiment of the invention suppresses the affect of the contact pressure with a fritting phenomenon. The fritting phenomenon is a phenomenon that when a potential gradient to be applied to an oxide film formed on the surface of a metal (in the invention, electrode pad) becomes approximately $10^5$ to $10^6$ V/cm, a current flows because of the thickness of the oxide film and the unevenness of the composition of the metal, and the oxide film is destroyed.

Figure 13:
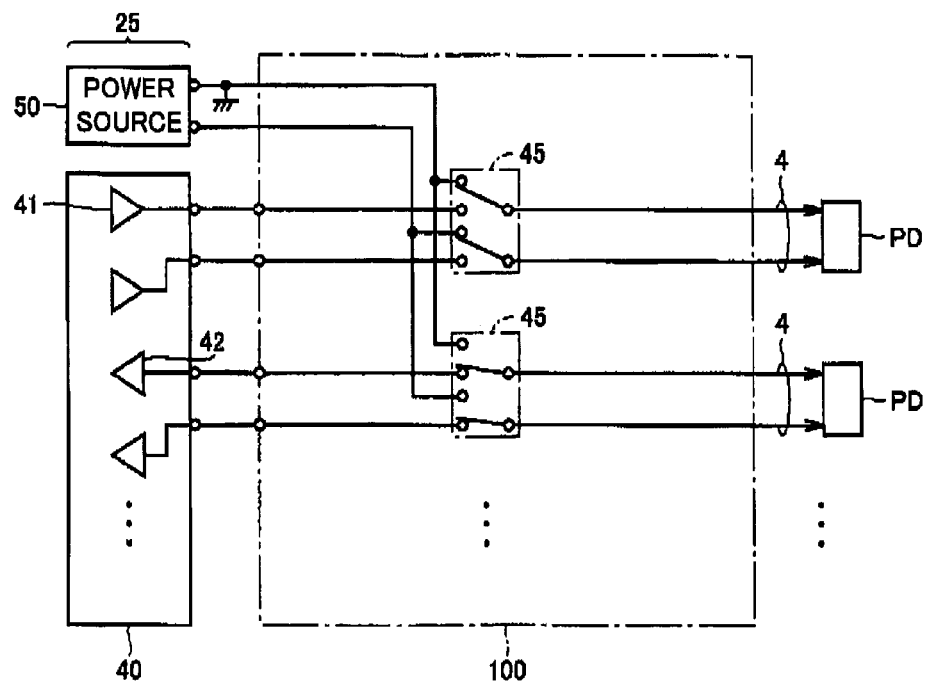
FIG. 13 is a diagram for explaining a connection between a measuring unit 25 and inspection electrodes PD according to an embodiment of the invention.

FIG. 13 is a diagram for explaining a connection between the measurement unit 25 and the inspection electrodes PD according to the embodiment of the invention Referring now to FIG. 13, the measurement unit 25 of the embodiment of the invention includes a fritting power source 50 and a measurement unit 40. The circuit substrate 100 of the probing card 6 has a pair of probes 4 which contact the respective plurality of the electrode pads PD of a chip, and relays 45 each being connected to each probe 4. The circuit substrate 100 switches the pair of probes 4 through the relays 45 between the measurement unit 40 and the fritting power source 50, and is connected to them.

The measurement unit 40 has drivers 41 and comparators 42, and is structured in such a manner as to output inspection signals from the drivers 41, and compare and determine an output result by the comparators 42. A structure that two drivers and two comparators are connected to the pair of probe is illustrated, but a structure that one driver and one comparator are connected may be employed.

The measurement section 25 of the embodiment causes a fritting phenomenon between the probes 4 and the electrode pads PD by applying a voltage between the pair of probes 4 from the fritting power source 50, and reduces a contact resistance between the probes 4 and the electrode pads PD. Reduction of the contact resistance by using the fritting phenomenon results in reduction of the contact pressures of the probes 4.

It is desirable that the compliance characteristic (flexibility) of the probe 4 should be large. The heights of the leading ends of the probes 4 to the substrate 100 are not exactly the same, and may slightly differ from one another. The relationship between the evenness precision of the height of the leading end of the probe 4 and the manufacturing cost of the probing card 6 are tradeoff. When the difference of the heights of the leading ends of the probes 4 are eliminated, and all probes 4 contact the electrode pads PD, if the compliance characteristic of the probe 4 is large, the difference of the contact pressure per probe 4 becomes small. By enhancing the compliance characteristic, the contact pressures can be approximately constant even if the heights of the leading ends of the probes 4 differ from one another.

It is structured in such a way that contact of the leading end of the probe 4 with the electrode pad PD is detected, and the probe 4 is pressed against the electrode pad PD by a predetermined length from a contact point (overdrive measure). Specifically, in a process of forming a three-dimensional structure on the substrate 10 like an MEMS, it is difficult to completely flatten the surface of the substrate 10, and heights slightly differ chip by chip, By detecting contact of the leading end of the probe 4 with an electrode pad PD, and pressing the probe 4 against the electrode pad PD by a constant overdrive measure, the contact pressure for each chip TP can be constant even if the heights of the chips TP differs from each other.

Possible method of detecting the contact of the leading end of the probe 4 with the electrode pad PD is, for example, a method of measuring the distance between the probing card and the electrode pad PD by laser measurement, a method of detecting a contact condition by extracting a shape from the images of the leading end of the probe 4 and the electrode pad PD, or a detection method by a change in an electrical resistance between the pair of probes 4 to be used for fritting. In case of the detection method by a change in the electrical resistance between the pair of probes 4, it can be detected from reduction of the electrical resistance as the pair of probes 4 contact one electrode pad PD from an open condition where the electrical resistance is extremely large.

In this manner, the difference of the height of each chip TP on the substrate 10 and the difference of the height of the leading end of each probe 4 are eliminated, and inspection of the microstructure with the contact pressures being constant can be carried out.

To inspect the microstructure, first, each one of the pair of probes 4 is made to contact each one of the electrode pads PD, and then the pair of probes 4 and the fritting power source 50 are connected together through the relays 45. It is desirable that at least the leading end of the probe 4 should vertically contact the device, i.e., each electrode pad PD. This is because that the affect originating from the contact pressure may appear in the X-axis and the Y-axis in a case of an oblique contact.

As explained above, it is detected that the leading ends of the probes 4 contact the electrode pads PD, the probes 4 are moved toward the electrode pads PD by a constant overdrive measure from the contact points, and the contact pressures are kept in constant in small values. The over driving measure is preset at an appropriate value in such a way that a contact resistance between the probe 4 and the electrode pad PD is reduced and a stress originating from the contact pressure from the probe 4 is suppressed so as to be neglected. As the probes 4 are displaced by a predetermined overdrive measure after they contact every chip TP of the substrate 10, affects to be applied to the chips TP are minimized, and it is possible to inspect the chips TP under the same condition chip by chip.

Next, a voltage is applied to one of the pair of probes 4 from the fritting power source 50. As the voltage rises gradually, a current which breaks an oxide film between the pair of the probes 4 flows therebetween by a fritting phenomenon based on a voltage difference applied to the pair of the probes 4, so that the probes 4 and the electrode pads PD are electrically conducted. Subsequently, the pair of the probes 4 are switched from the fritting power source 50 to the measurement unit 40 through the relays 45, and electrically connected to the measurement unit 40. In the example, the explanation has been given to the structure that realizes switch-over between the fritting power source 50 and the measurement unit 40 by using the relays 45, but the structure is not limited to this, and it is possible to perform such a switch-over by using semiconductor switches instead of the relays 45.

An inspection signal is applied to the electrode pads PD from the measurement unit 40 through the probes 4 to do a predetermined wafer inspection. As mentioned above, in a case of utilizing a fritting phenomenon, the contact pressure between the probe 4 and the electrode pad PD can be set at extremely small, so that the electrode pad or the like is not likely to be damaged, and this enables a highly reliable inspection.

Second Embodiment

In the aforementioned embodiment, the explanation has been given to the point that a non-vibration type thermoacoustic engine can be used as the speaker 2, but the speaker 2 is not limited to that engine, and for example, a normal mechanical vibration type speaker can be used.

Figure 14A:
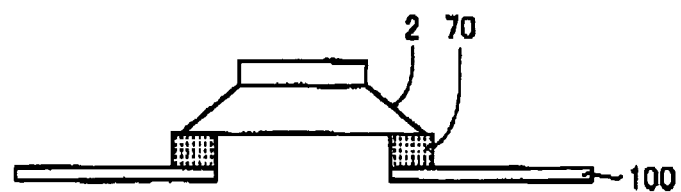
FIGS. 14A to 14C are diagrams for explaining the structure of a probing card according to the second embodiment of the invention.
Figure 14B:
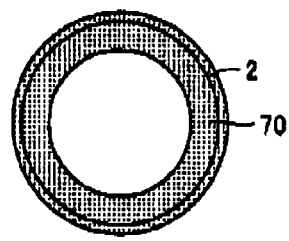
Figure 14C:
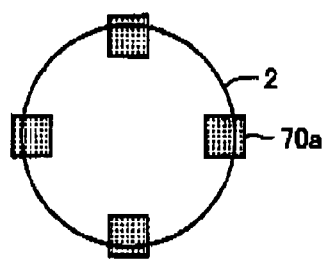

FIGS. 14A to 14C are diagrams for explaining the structure of a probing card according to the second embodiment of the invention.

Referring now to FIG. 14A, the speaker 2 is mounted on the circuit substrate 100. The speaker 2 is supported by a support member with respect to the circuit substrate 100, and the support member can be made of a vibration absorbing material (vibration isolator) 70. This makes it possible to prevent transmission of vibrations from the speaker 2 to the circuit substrate 100, and perform highly precise inspection. A possible vibration absorbing material 70 is a silicon rubber, a resin, or the like.

FIG. 14B is a diagram for explaining a case where the support member made of a vibration absorbing material is provided along the aperture region of the circuit substrate 100.

FIG. 14C illustrates a structure of the support member that further prevents transmission of vibrations by reducing a contact area of circuit substrate 100 with the speaker 2. A case where four point vibration isolators 70a support the speaker 2 is illustrated in the figure.

First Modified Example of the Second Embodiment

Figure 15A:
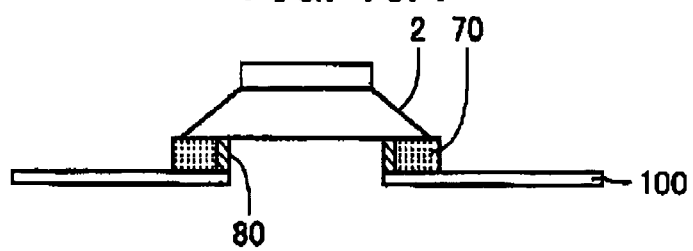
FIGS. 15A and 15B are diagrams for explaining the store of a probing card according to the first modified example of the second embodiment of the invention.
Figure 15B:
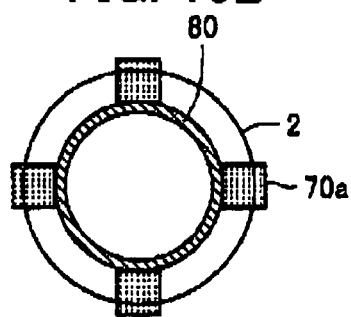

FIGS. 15A and 15B are diagrams for explaining the structure of a probing card according to the first modified example of the second embodiment of the invention Referring now to FIG. 15A, the speaker 2 is supported by a support member made of a vibration absorbing material on the circuit substrate 100, and as illustrated in FIG. 15B, a sound isolation member (soundproof material) 80 is provided between the circuit substrate 100 and the speaker 2 along the edge of the aperture region. This prevents a leakage of a test sound wave to a portion other than the aperture region, and eliminates affects of an externally generated sound (noise), so that a test sound wave with intensive directional characteristics can be output.

Second Modified Example of the Second Embodiment

FIGS. 16A and 16B are diagrams for explaining the structure of a probing card according to the second modified example of the second embodiment of the invention Referring now to FIG. 16A, the speaker 2 is mounted on the circuit substrate 100. With respect to the circuit substrate 100, the speaker 2 is supported by a support member 75 which is made of a vibration absorbing material. Point support members 75a which support the speaker 2 at plural points as illustrated in FIG. 16B are used as the support member. The speaker 2 is supported at four points. Accordingly, as an area where the speaker 2 and the circuit substrate 100 contact with each other is further reduced, it is possible to further prevent transmission of vibrations from the speaker 2 to the circuit substrate 100, and perform highly precise inspection.

Third Modified Example of the Second Embodiment

FIGS. 17A and 17B are diagrams for explaining the structure of a probing card according to the third modified example of the second embodiment of the invention.

Referring now to FIG. 17A, the speaker 2 is supported by the support member made of a vibration absorbing material on the circuit substrate 100, and as illustrated in FIG. 17B, a sound isolation member is provided between the circuit substrate 100 and the speaker 2 along with the aperture region. This prevents leakage of a test sound wave to a portion other than the aperture region, and a test sound wave having intensive directional characteristics can be output.

Fourth Modified Example of the Second Embodiment

FIG. 18 is a diagram illustrating the structure of a probing card according to the fourth modified example of the second embodiment of the invention.

Referring now to FIG. 18, the probing card of the fourth modified example of the second embodiment of the invention further has a sound collector 85 which collects and outputs a test sound wave output from the speaker 2, in addition to the structure of the probing card explained with FIG. 14. The sound collector 85 is provided between the substrate and the probing card along the periphery of the aperture region of the probing card in such a manner as not to leak a test sound wave between the substrate and the probing card and concentrate the test sound wave on the moving section of the microstructure. The sound collector 85 has the structure which is the same as the structure that a horn is reversely attached for example, and can output a test sound wave having intensive directional characteristics.

The sound collector 85 also functions as a post (fixation stage) of the probes 4. Even if the probes 4 are constituted by highly compliance (easily flexible) materials, the post portion is not likely to deform. As support points of the canti-lever structures of the probes 4 are close to the substrate, the displacement directions of the leading ends of the probes 4 are almost vertical to the substrate 10. Accordingly, as the substrate 10 is moved in a direction vertical to a substrate surface with respect to the probing card and the probe 4 and the substrate 10 are contacted with each other, only a stress in a direction vertical to the substrate 10 is generated even if the leading end of the probe 4 contacts-the substrate 10 and the aforementioned overdrive measure is changed. This results in carrying out a microstructure test in a state where no stress in the direction of the substrate surface is applied to the microstructure.

The probing card may be provided with plural sets of the speaker 2, the aperture region, the sound collector 85, and the probes 4, and may be structure in such a manner as to carry out the tests of the plurality of chips TP on the substrate 10 at the same time. In this case, because the individual sound collector 85 can shut off test sound waves between the chips TP to be tested, it is possible to carry out the tests at the same time without interferences among the plurality of chips TP.

Fifth Modified Example of the Second Embodiment

Figure 19A:
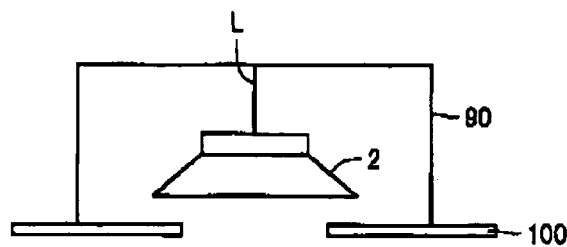
FIGS. 19A to 19C are diagrams for explaining the structure of a probing card according to the fifth modified example of the second embodiment of the invention.
Figure 19B:
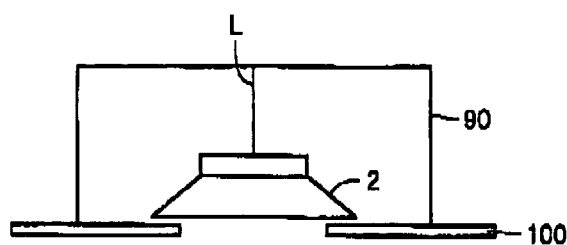
Figure 19C:
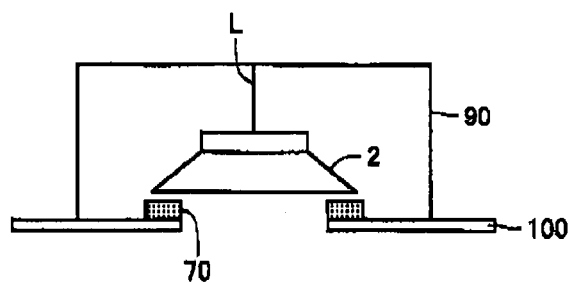

FIGS. 19A to 19C are diagrams for explaining the structure of a probing card according to the fifth modified example of the second embodiment of the invention.

Referring now to FIG. 19A, the speaker 2 is fixed by the support member over the substrate in a hanged manner. Specifically, the probing card is structured that a member 90 (cover) which is so connected to the circuit substrate 100 as to cover the speaker 2 is provided on the circuit substrate 100, and the speaker 2 is hanged perform the upper portion of the member 90 by a cable L.

This structure reduces the contact area because the speaker 2 is supported by the cable L, so that vibrations are not easily transmitted. Accordingly, it is possible to fuller prevent transmission of vibrations from the speaker 2 to the circuit substrate, and perform highly precise inspection.

FIG. 19B is a diagram illustrating a case where the length of the cable L is adjusted and the speaker 2 is come close to near the aperture region. Employing such a structure suppresses leakage of a test sound wave, and it is possible to output a test sound wave having intensive directional characteristics from the aperture region.

Further, as illustrated in FIG. 19C, as the sound isolation member 80 is provided between the speaker 2 and the circuit substrate along the aperture region, it is possible to suppress the leakage of the test sound wave and output the test sound wave with intensive directional characteristics.

Third Embodiment

Figure 20:
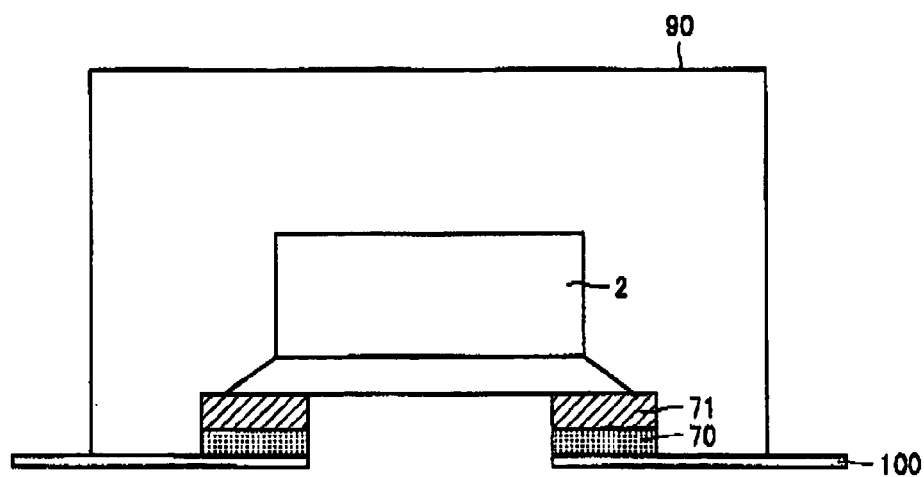
FIG. 20 is a diagram for explaining the structure of a probing card according to the third embodiment of the invention.

FIG. 20 is a diagram for explaining the structure of a probing card according to the third embodiment of the invention.

Referring now to FIG. 20, the probing card of the third embodiment of the invention differs that the member 90 is provided on the circuit substrate 100 in such a manner as to cover the speaker 2 and another member 71 different from the vibration isolator 70 is further provided between the vibration isolator 70 and the speaker 2, in comparison with the structure of the probing card explained wit FIG. 14. Another member 71 can be made of a material harder than the vibration isolator 70, and for example, a ceramic material, a lumber, or the like can be used. The material of the member 71 is not limited to the ceramic material or the like, various materials can be used, but it is desirable that should have thermal isolation properties or a small heat transfer coefficient.

According to this structure, because the speaker 2 can be mounted on the relatively hard material, it is possible to stably fix the speaker 2.

The explanation has been given to the structure that disposes the vibration isolator 70 and the member 71 in this order between the circuit substrate 100 and the speaker 2, but the disposing order of the vibration isolator 70 and member 71 may be reversed.

The structure that the vibration isolator 70 and the member 71 are provided as a set has been explained, but is not limited to this, and it is obviously possible to superimpose plural sets of the vibration isolator and member.

In the example, because the member 90 (cover) which is connected to the circuit substrate 100 in such a manner as to cover the speaker 2, it is possible to prevent diffraction of a sound to be output toward the rear of the speaker 2 along with the vibration of the speaker 2. This suppresses the rearward diffraction of a test sound wave, thereby improving the controllability of the test sound wave.

Modified Example of the Third Embodiment

The explanation has been given to the structure that the member 90 (cover) is provided on the circuit substrate 100 as to simply cover the speaker 2 in the third embodiment, but a structure that the member (cover) and the speaker 2 may be integrally provided on the circuit substrate 100.

Figure 21:
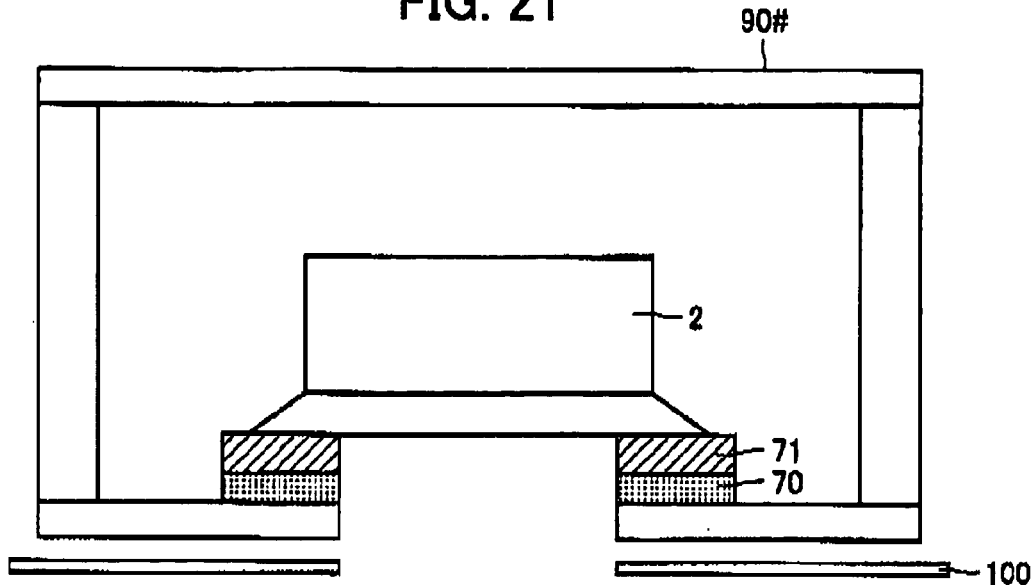
FIG. 21 is a diagram for explaining the structure of a probing card according to an modified example of the third embodiment of the invention.

FIG. 21 is a diagram for explaining the structure of a probing card of the modified example of the third embodiment of the invention.

Referring now to FIG. 21, the probing card of the modified example of the third embodiment of the invention has a different structure that the member (cover) 90 is replaced by a member (cover) 90#, in comparison with the structure of the probing card explained with FIG. 20. The member 90# is provided in such a manner as to be a box-like shape having an aperture region which is the same as aperture region of the circuit substrate 100 as an example. The vibration isolator 70 and the member 71 are joined together in the member 90# formed in the box-like shape. The speaker 2 is mounted on the member 71, That is, it is structured in such a way that the speaker 2 is accommodated in the box-like shape member (cover) 90.

This structure prevents diffraction of a sound to be output toward the rear of the speaker 2 along with the vibration of the speaker 2. Accordingly, the rearward diffraction of a test sound wave is suppressed, thereby improving the controllability of the test sound wave. According to the employed structure, provided that the box-like shape member (cover) 90# is provided attachable and removable with respect to the circuit substrate 100.

Accordingly, as the speaker side accommodated in the member 90# and the probe side provided on the circuit substrate 100 can be independently molded, it is possible to mass-produce the probing card at fast or efficiently.

Fourth Embodiment

A method of applying a test sound wave efficiently to a device group to be measured will be explained in the fourth embodiment. That is, an explanation will be given to alignment of the position of the aperture region of the circuit substrate 100 with a device to be measured.

Figure 22A:
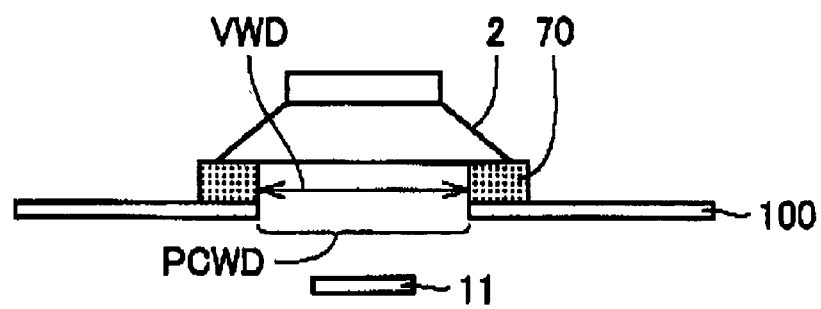
FIGS. 22A and 22B are diagrams for explaining a positional relationship between a device to be measured and an aperture region according to the fourth embodiment of the invention.
Figure 22B:
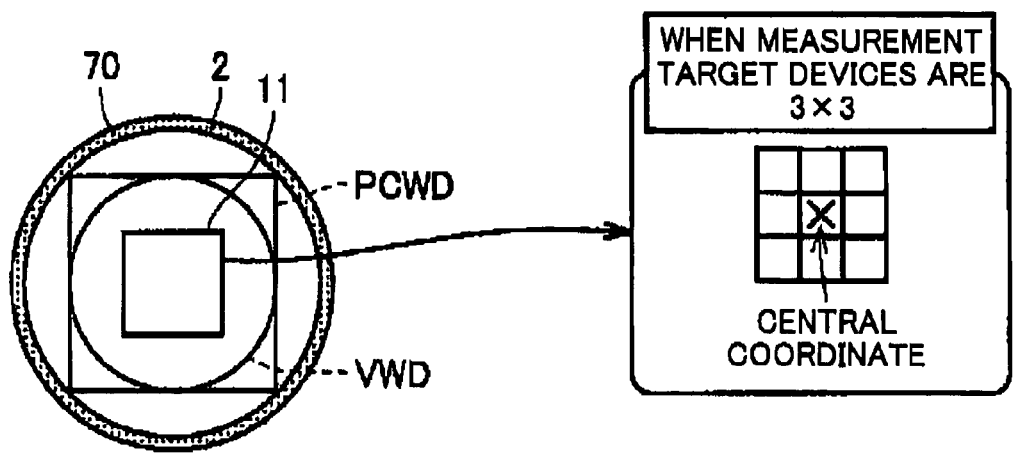

FIGS. 22A and 22B are diagrams for explaining the positional relationship between a measurement target device and the aperture region according to the fourth embodiment of the invention.

Referring now to FIG. 22A, the figure illustrates a probing card and a measurement device group 11 as viewed from the lateral side. According to the structure of the fourth embodiment, the measurement device 11 is disposed in such a way that a central axis vertical to the aperture plane of an aperture region PCWD of the probing card passes through the center of the measurement device 11.

FIG. 22B illustrates the probing card and the measurement device group 11 as viewed from the directly above. Specifically, the speaker 2 is mounted on the vibration isolator 70. The vibration isolator 70 is formed in a circular shape along the shape of the speaker 2, and an aperture region VWD of the vibration isolator 70 is circular. The aperture region of the circuit substrate 100 is provided as the rectangular aperture region PCWD. The square aperture region is illustrated as just an example.

In the example, the measurement device group 11 is disposed at a position through which the central axis of the aperture region passes through. Specifically, as illustrated in FIGS. 22A and 22B, in a case where the measurement device group 11 comprises a collection of 3×3 plural chips, the measurement device group 11 is disposed in such a way that the central axis passes through the central chip. The explanation has been given to the measurement device group 11 constituted by the plural chips, but the measurement device group 11 is not limited to this, and a case of a single chip is applicable. Specifically, regarding a single chip, the measurement device group 11 is disposed in such a way that the central axis of the aperture region passes through the single chip.

Accordingly, a test sound wave output from the speaker 2 can be efficiently applied to the measurement device group 11.

Next, an explanation will be given to an alignment in a case of using plural speakers 2.

Figure 23A:
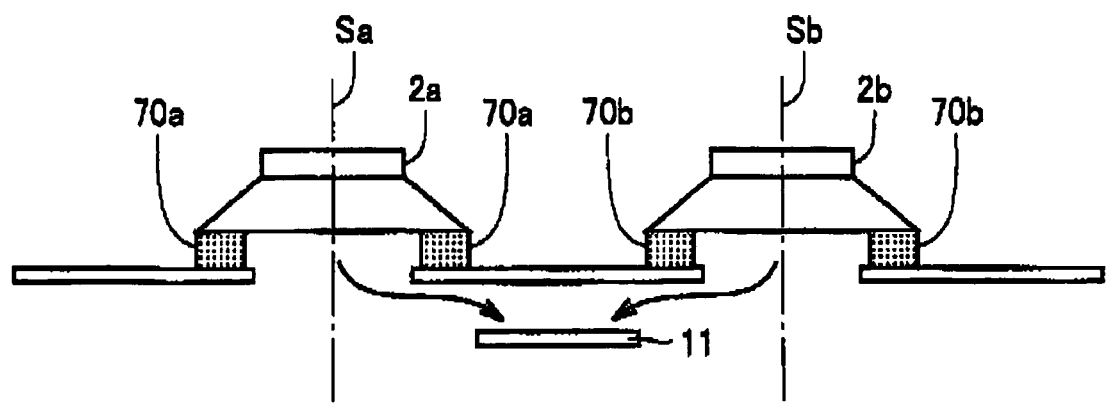
FIGS. 23A and 23B are diagrams for explaining a positional relationship between a device to be measured and an aperture region according to a modified example of the fourth embodiment of the invention.
Figure 23B:
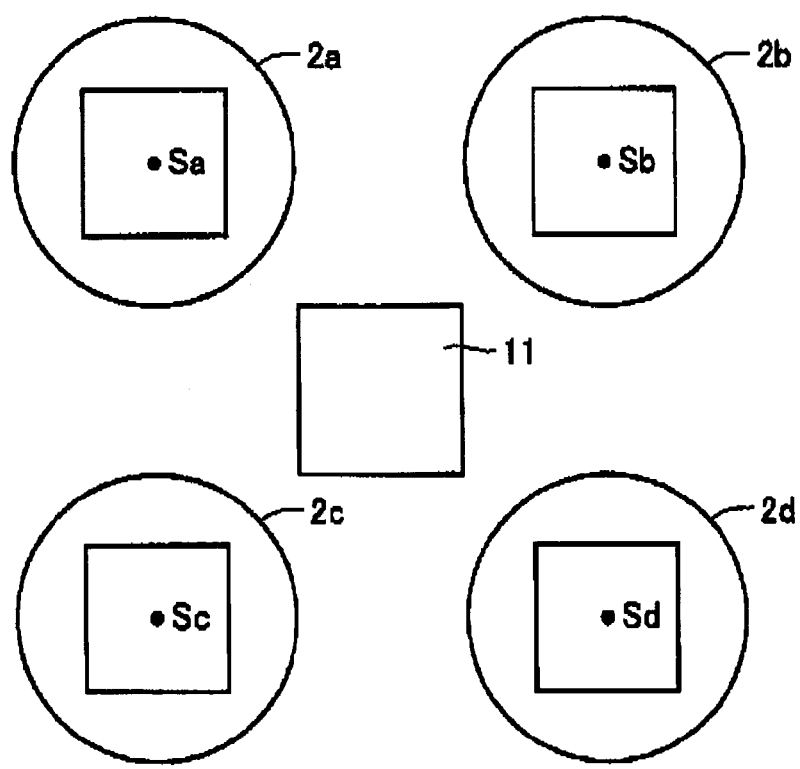

FIGS. 23A and 23B are diagrams explaining a positional relationship between a measurement target device and an aperture region according to the modified embodiment of the fourth embodiment of the invention. An explanation will be given to a case where the four speakers 2 are used and the speakers 2 and the aperture regions are provided in a square shape.

Referring now to FIG. 23A, the probing card and the measurement device group 11 are illustrated as viewed from the lateral side.

FIG. 23B is a diagram illustrating the probing card and the measurement device group 11 as viewed from the directly above. Four speakers 2a to 2d are illustrated.

Provided that the central axes of the aperture regions of the circuit substrates corresponding to the individual speakers 2a to 2d are denoted as Sa to Sd. According to the embodiment, the measurement device group 11 is disposed at a position through which the central axis of a regional face surrounded by the individual central axes Sa to Sd passes.

Accordingly, distances from the individual aperture regions of the circuit substrates to the measurement device group 11 are set at equal. That is, because test sound waves are equally applied to the measurement device group 11 from the individual speakers 2a to 2d, the test sound waves can be efficiently applied to the measurement device group 11. The explanation has been given to the measurement device group 11 constituted by the plurality of chips, but the measurement device group 11 is not limited to this, and a case of a single chip is applicable. Specifically, a single chip is disposed at a position through which the central axis of a regional face surrounded by the individual central axes Sa to Sd passes.

The explanation has been mainly given to the 3-axis accelerometer in the examples, but the invention is not limited to this, and for other MEMS devices, the same effectiveness as that of the 3-axis accelerometer can be obtained by applying a test sound wave according to the first and second embodiments to a moving section of a microstructure.

It should be noted that the disclosed embodiments are just examples, and are not for limiting the invention. The scope of the invention should be indicated not by the aforementioned explanations but the claims, and implications equivalent to the claims and modifications within the scope of the invention should be intended to be included in the invention.

INDUSTRIAL APPLICABILITY

According to the invention, a probing card and a microstructure inspection apparatus include a sound wave generator which is for outputting a test sound wave to a moving section of a microstructure, and a measurement unit detects the motion of the moving section of the microstructure in response to the test sound wave output from the sound wave generator through a probe, and evaluates the characteristic of the microstructure based on a detection result. Because the probing card includes the sound wave generator, the sound wave generator is aligned by alignment adjustment of the probe of the probing card, so that it is not necessary to independently perform alignment adjustment on the sound wave generator, and a mechanism for the alignment adjustment of the sound wave generator is not required, thereby improving efficiencies and enabling a test by a simple method.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments.

Various modifications made within the meaning of an equivalent of the claims of the invention and within the claims are to be regarded to be in the scope of the present invention.

This application is based on Japanese Patent Application No. 2005-102760 filed on Mar. 31, 2005 and No. 2005-266720 filed on Sep. 14, 2005 and including specification, claims, drawings and summary. The disclosure of the above Japanese Patent Application is incorporated herein by reference in its entirety.

What is claimed is:

1. A probing card connected to an evaluation unit which evaluates a characteristic of at least one microstructure having a moving section formed on a substrate, comprising:
    a probe electrically connected to an inspection electrode of said microstructure formed on said substrate to detect electrical change based on a motion of said moving section formed on said substrate at a time of testing;
    at least one sound wave generator for outputting a test sound wave to said moving section of said microstructure; and
    a microphone which detects said test sound wave output from said sound wave generator,
    wherein a characteristic of a test sound wave output from said sound wave generator is adjusted based on a detection result by said microphone.

2. A probing card connected to an evaluation unit which evaluates a characteristic of at least one microstructure having a moving section formed on a substrate, comprising:
    a probe electrically connected to an inspection electrode of said microstructure formed on said substrate to detect electrical change based on a motion of said moving section formed on said substrate at a time of testing;
    at least one sound wave generator for outputting a test sound wave to said moving section of said microstructure; and
    a fixation member which fixes said probe, and has an aperture region through which said test sound wave is output to said moving section of said microstructure from said sound wave generator.

3. The probing card according to claim 2, further comprising:
    a support member for mounting said sound wave generator on said fixation member,
    wherein said sound wave generator outputs said test sound wave by a mechanical vibrational operation, and
    wherein said support member has a vibration absorbing material which suppresses vibration of said sound wave generator.

4. The probing card according to claim 3, where said support member has a plurality of point support sections which support said sound wave generator at plural points.

5. The probing card according to claim 3, further comprising:
    a soundproof material which is provided between said fixation member and said sound wave generator and along the edge of said aperture region in such a way that said test sound wave does not leak from between said fixations member and said sound wave generator.

6. The probing card according to claim 3, wherein said support member has at least one of a first and a second support member units provided between said sound wave generator and said fixation member, and
    wherein one of said first and second support member units is made of a vibration absorbing material, while the other support member unit is made of a material harder than the material of said one support member.

7. The probing card according to claim 2, wherein said probe protrudes with respect to said aperture region.

8. The probing card according to claim 2, further comprising:
    a cover for covering said sound wave generator in an other region than said aperture region, and is joined to said fixation member.

9. The probing card according to claim 2, wherein said microstructure formed on said substrate is disposed at a position through which a central axis of said aperture region passes.

10. The probing card according to claim 2, comprising a plurality of sound wave generators,
    wherein said fixation member has a plurality of aperture regions which are so provided as to respectively correspond to said plurality of sound wave generators, and through which said test sound wave is output to said moving section of said microstructure from each sound wave generator, and
    wherein said microstructure is disposed at a position through which a central axis of a region surface surrounded by central axes of said individual aperture regions passes.

11. The probing card according to claim 2, further comprising:
    a sound collecting member provided between said substrate and the probing card and along the edge of said aperture region in such a way that said test sound wave does not leak from between said substance and the probing card, but is collected to said moving section.

12. The probing card according to claim 11, wherein said sound collecting member is a part of said fixation member which fixes said probe.

13. A probing card connected to an evaluation unit which evaluates a characteristic of at least one microstructure having a moving section formed on a substrate, comprising:
    a probe electrically connected to an inspection electrode of said microstructure formed on said substrate to detect electrical change based on a motion of said moving section formed on said substrate at a time of testing; and
    at least one sound wave generator for outputting a test sound wave to said moving section of said microstructue,
    wherein a leading end of said probe is formed in such a manner as to vertically contact said inspection electrode of said microstructure.

14. A probing card connected to an evaluation unit which evaluates a characteristic of at least one microstructure having a moving section formed on a substrate, comprising:
    a probe electrically connected to an inspection electrode of said microstructure formed on said substrate to detect electrical change based on a motion of said moving section formed on said substrate at a time of testing;
    at least one sound wave generator for outputting a test sound wave to said moving section of said microstructure by a mechanical vibrational operation;
    a fixation member which fixes said probe and has an aperture region through which said test sound wave is output to said moving section of said microstructure from said sound wave generator; and
    a support member which supports said sound wave generator in a hanging manner to said aperture region of said fixation member.

15. The probing card according to claim 14, further comprising:
a soundproof material which is provided between said fixation member and said sound wave generator and along the edge of said aperture region in such a way that said test sound wave does not leak from between said fixation member and said sound wave generator.

16. A probing card connected to an evaluation unit which evaluates a characteristic of at least one microstructure having a moving section formed on a substrate, comprising,
a probe electrically connected to an inspection electrode of said microstructure formed on said substrate to detect electrical change based on a motion of said moving section formed on said substrate at a time of testing;
at least one sound wave generator for outputting a test sound wave to said moving section of said microstructure; and
a conduction unit which ensures conduction between said probe and said inspection electrode with a fritting phenomenon.

17. The probing card according to claim 16, wherein said conduction unit comprises a fritting power source which is used for applying a voltage to said inspection electrode to cause said fritting phenomenon before a test, and
a switching circuit which is connected to said fritting power source at a time of causing said fritting phenomenon before said test, and is connected to an external inspection apparatus at a time of testing.

18. A microstructure inspection apparatus connected to an evaluation unit which evaluates a characteristic of at least one microstructure having a moving section formed on a substrate, comprising:
the probing card as set forth in claim 1; and
said evaluation unit which is connected to the probing card, and evaluates a characteristic of said microstructure,
wherein said evaluation unit detects motion of said moving section of said microstructure having responded to said test sound wave output from said sound wave generator, through said probe, and evaluates said characteristic of said microstructure based on a detection result.

19. A probing card connected to an evaluation unit which evaluates a characteristic of at least one microstructure having a moving section formed on a substrate, comprising:
a probe electrically connected to an inspection electrode of said microstructure formed on said substrate to detect electrical change based on a motion of said moving section formed on said substrate at a time of testing; and
at least one sound wave generator for outputting a test sound wave to said moving section of said microstructure by a non-vibrational operation except a mechanical vibrational operation.

20. The probing card according to claim 19, wherein said sound wave generator includes a thermoacoustic engine which outputs said test sound wave based on heat-originated expansion or compression of an air.

21. A microstructure inspection apparatus connected to an evaluation unit which evaluates a characteristic of at least one microstructure having a moving section formed on a substrate, comprising:
the probing card as set forth in claim 19; and
said evaluation unit which is connected to the probing card, and evaluates a characteristic of said microstructure,
wherein said evaluation unit detects motion of said moving section of said microstructure having responded to said test sound wave output from said sound wave generator, through said probe, and evaluates said characteristic of said microstructure based on a detection result.

22. A microstructure inspection apparatus connected to an evaluation unit which evaluates a characteristic of at least one microstructure having a moving section formed on a substrate, comprising:
the probing card as set forth in claim 2; and
said evaluation unit which is connected to the probing card, and evaluates a characteristic of said microstructure,
wherein said evaluation unit detects motion of said moving section of said microstructure having responded to said test sound wave output from said sound wave generator, through said probe, and evaluates said characteristic of said microstructure based on a detection result.

23. A microstructure inspection apparatus connected to an evaluation unit which evaluates a characteristic of at least one microstructure having a moving section formed on a substrate, comprising:
the probing card as set forth in claim 13, and
said evaluation unit which is connected to the probing card, and evaluates a characteristic of said microstructure,
wherein said evaluation unit detects motion of said moving section of said microstructure having responded to said test sound wave output from said sound wave generator, through said probe, and evaluates said characteristic of said microstructure based on a detection result.

24. A microstructure inspection apparatus connected to an evaluation unit which evaluates a characteristic of at least one microstructure having a moving section formed on a substrate, comprising:
the probing card as set forth in claim 14; and
said evaluation unit which is connected to the probing card, and evaluates a characteristic of said microstructure,
wherein said evaluation unit detects motion of said moving section of said microstructure having responded to said test sound wave output from said sound wave generator, through said probe, and evaluates said characteristic of said microstructure based on a detection result.

25. A microstructure inspection apparatus connected to an evaluation unit which evaluates a characteristic of at least one microstructure having a moving section formed on a substrate, comprising:
the probing card as set forth in claim 16; and
said evaluation unit which is connected to the probing card, and evaluates a characteristic of said microstructure,
wherein said evaluation unit detects motion of said moving section of said microstructure having responded to said test sound wave output from said sound wave generator, through said probe, and evaluates said characteristic of said microstructure based on a detection result.

* * * * *